US010622560B2

(12) United States Patent
Howard et al.

(10) Patent No.: US 10,622,560 B2
(45) Date of Patent: Apr. 14, 2020

(54) SEMICONDUCTOR CHIPS AND SYSTEMS HAVING PHASE-CHANGE MATERIAL (PCM) SWITCHES INTEGRATED WITH MICRO-ELECTRICAL-MECHANICAL SYSTEMS (MEMS) AND/OR RESONATORS

(71) Applicant: Newport Fab, LLC, Newport Beach, CA (US)

(72) Inventors: David J. Howard, Irvine, CA (US); Nabil El-Hinnawy, Irvine, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 16/402,630

(22) Filed: May 3, 2019

(65) Prior Publication Data
US 2020/0058865 A1 Feb. 20, 2020

Related U.S. Application Data

(63) Continuation-in-part of application No. 16/161,960, filed on Oct. 16, 2018, and a continuation-in-part of
(Continued)

(51) Int. Cl.
*H01L 45/00* (2006.01)

(52) U.S. Cl.
CPC ........ *H01L 45/1286* (2013.01); *H01L 45/126* (2013.01); *H01L 45/1293* (2013.01);
(Continued)

(58) Field of Classification Search
None
See application file for complete search history.

(56) References Cited

U.S. PATENT DOCUMENTS 5,976,932 A 11/1999 Kerber
6,448,576 B1 9/2002 Davis
(Continued)

FOREIGN PATENT DOCUMENTS

WO WO 2016/028362 2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.
(Continued)

*Primary Examiner* — Evren Seven
(74) *Attorney, Agent, or Firm* — Farjami & Farjami LLP

(57) ABSTRACT

A semiconductor chip or system, such as a multi-chip module (MCM), a system-in-package (SiP), and/or a printed circuit board (PCB) module, includes a substrate, a resonator and/or a micro-electrical-mechanical system (MEMS), and a phase-change material (PCM) switch. The PCM switch includes a hearing element, a PCM situated over the heating element, and PCM contacts connected to passive segments of the PCM. The heating element is transverse to the PCM and approximately defines an active segment of the PCM. The PCM contacts are electrically connected to the resonator and/or the MEMS in a shared routing region of the semiconductor chip. The PCM switch is configured to engage or disengage the resonator and/or the MEMS. In one approach, a plurality of PCM switches are capable of reconfiguring an array of resonators and/or an array of MEMS. In another approach, a redundant PCM switch is electrically connected to a redundant resonator and/or a redundant MEMS.

17 Claims, 15 Drawing Sheets

Related U.S. Application Data application No. 16/114,106, filed on Aug. 27, 2018, and a continuation-in-part of application No. 16/103,587, filed on Aug. 14, 2018, and a continuation-in-part of application No. 16/103,490, filed on Aug. 14, 2018, and a continuation-in-part of application No. 16/103,646, filed on Aug. 14, 2018.

(52) U.S. Cl.
CPC ........ *H01L 45/144* (2013.01); *H01L 45/1608* (2013.01); *H01L 45/1641* (2013.01)

(56) References Cited

U.S. PATENT DOCUMENTS

| | | | | |
|---|---|---|---|---|
| 7,522,029 | B1* | 4/2009 | Lantz | B81B 3/0072 337/139 |
| 8,314,983 | B2* | 11/2012 | Frank | B81B 3/0072 359/221.1 |
| 9,257,647 | B2 | 2/2016 | Borodulin | |
| 9,362,492 | B2 | 6/2016 | Goktepeli | |
| 9,368,720 | B1* | 6/2016 | Moon | H01L 45/1286 |
| 9,444,430 | B1 | 9/2016 | Abdo | |
| 9,640,759 | B1* | 5/2017 | Curioni | H01L 45/149 |
| 9,891,112 | B1* | 2/2018 | Abel | G01J 5/0853 |
| 2005/0127348 | A1* | 6/2005 | Horak | H01L 45/06 257/3 |
| 2006/0246712 | A1* | 11/2006 | Kim | H01L 27/2427 438/622 |
| 2007/0075347 | A1* | 4/2007 | Lai | H01L 45/06 257/296 |
| 2010/0084626 | A1* | 4/2010 | Delhougne | H01L 27/2436 257/4 |
| 2010/0238720 | A1* | 9/2010 | Tio Castro | H01L 45/06 365/163 |
| 2011/0291784 | A1 | 12/2011 | Nakatsuji | |
| 2013/0187120 | A1* | 7/2013 | Redaelli | H01L 45/06 257/5 |
| 2013/0285000 | A1* | 10/2013 | Arai | H01L 45/128 257/3 |
| 2014/0191181 | A1* | 7/2014 | Moon | H01L 27/2409 257/4 |
| 2014/0264230 | A1* | 9/2014 | Borodulin | H01L 45/126 257/4 |
| 2015/0090949 | A1* | 4/2015 | Chang | H01L 45/1253 257/4 |
| 2016/0035973 | A1* | 2/2016 | Raieszadeh | H01L 45/06 257/4 |
| 2016/0071653 | A1 | 3/2016 | Lamorey | |
| 2016/0308507 | A1* | 10/2016 | Engelen | H02N 11/00 |
| 2017/0092694 | A1* | 3/2017 | BrightSky | H01L 27/2463 |
| 2017/0126205 | A1 | 5/2017 | Lin | |
| 2017/0187347 | A1* | 6/2017 | Rinaldi | H03H 3/02 |
| 2017/0365427 | A1* | 12/2017 | Borodulin | H01L 45/06 |
| 2018/0005786 | A1 | 1/2018 | Navarro | |
| 2018/0194615 | A1* | 7/2018 | Nawaz | H04R 19/005 |
| 2018/0269393 | A1* | 9/2018 | Zhang | H01L 45/126 |
| 2019/0064555 | A1* | 2/2019 | Hosseini | G02F 1/0147 |
| 2019/0067572 | A1* | 2/2019 | Tsai | H01L 45/1286 |
| 2019/0172657 | A1* | 6/2019 | Zhu | G01K 5/486 |
| 2019/0267214 | A1 | 8/2019 | Liu | |

OTHER PUBLICATIONS

Balavalad, Kirankumar B. et al, "Design and Simulation of MEMS Capacitive Pressure Sensor Array for Wide Range Pressure Measurement," International Journal of Computer Applications, vol. 163, No. 6, Apr. 2017, available at https://www.researchgate.net/publication/316177637_Design_and_Simulation_of_MEMS_Capacitive_Pressure_Sensor_Array_for_Wide_Range_Pressure_Measurement.

Hou, Stephen Ming-Chang, "Design and Fabrication of a MEMS-Array Pressure Sensor System for Passive Underwater Navigation Inspired by the Lateral Line," Massachusetts Institute of Technology, Jun. 2012, available at https://dspace.mit.edu/handle/1721.1/75454.

* cited by examiner

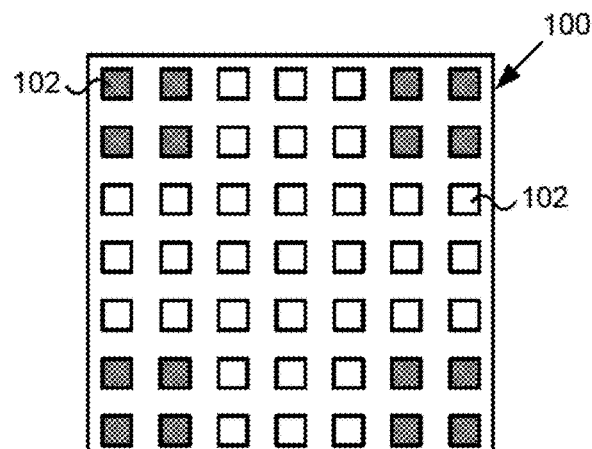
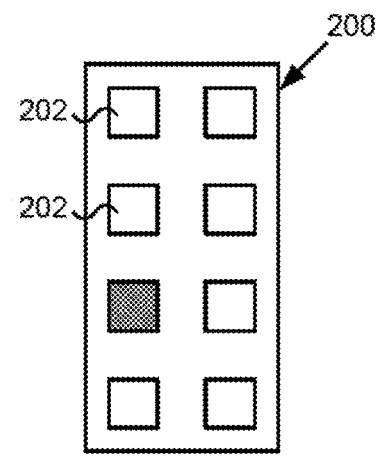
FIG. 1A
FIG. 2A
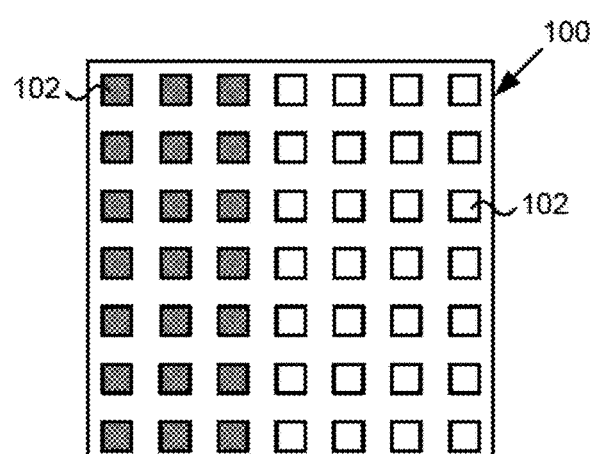
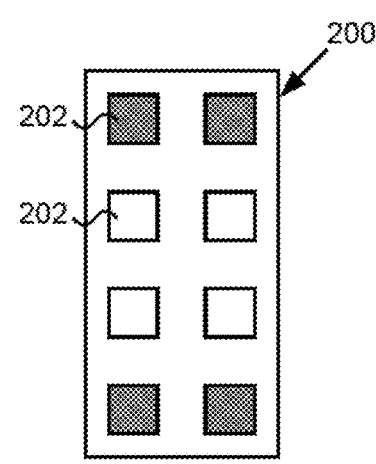
FIG. 1B
FIG. 2B
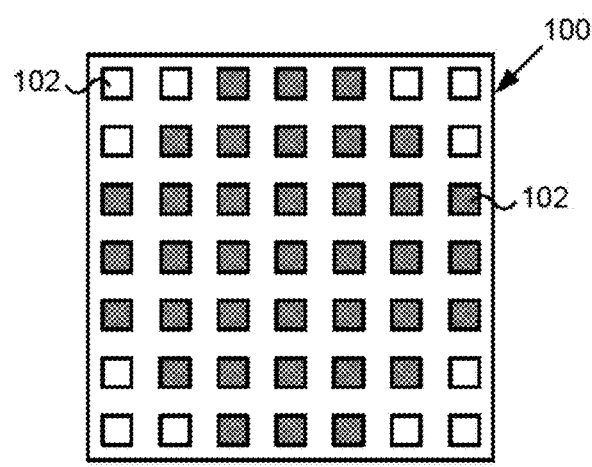
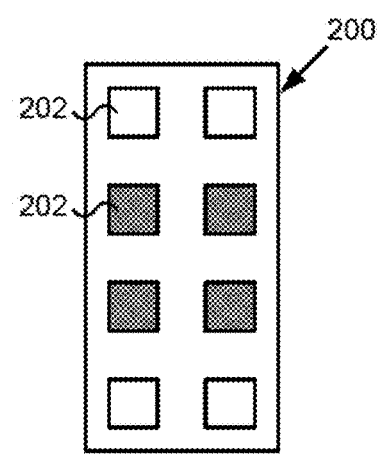
FIG. 1C
FIG. 2C

SEMICONDUCTOR CHIPS AND SYSTEMS HAVING PHASE-CHANGE MATERIAL (PCM) SWITCHES INTEGRATED WITH MICRO-ELECTRICAL-MECHANICAL SYSTEMS (MEMS) AND/OR RESONATORS

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material." The present application is also a continuation-in-part of and claims the benefit of and priority to application Ser. No. 16/103,587 filed on Aug. 14, 2018, titled "Design for High Reliability RF Switch Based on Phase-Change Material." The present application is also a continuation-in-part of and claims the benefit of and priority to application Ser. No. 16/103,646 filed on Aug. 14, 2018, titled "PCM RF Switch Fabrication with Subtractively Formed Heater." The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element." The present application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance." The disclosures and contents of all of the above-identified applications are hereby incorporated fully by reference into the present application.

BACKGROUND

Semiconductor chips using passive devices, filters, and various types of micro-electrical-mechanical systems (MEMS) often employ switches for engaging and disengaging various types of filters (e.g., resonators), passive devices, and/or MEMS from other components in the semiconductor chip. Moreover, in various applications it is desirable to use switches to properly form and reconfigure arrays of various types of MEMS, resonators, and passive devices.

Integrating such switches in semiconductor chips without significant performance tradeoffs can be complex. Conventional switches, and conventional techniques used to integrate them, introduce significant insertion losses. Where the semiconductor chip employs numerous switches corresponding to an array of resonators and/or an array of MEMS, these losses can prohibit the semiconductor chip from functioning as intended. Further, conventional switches are typically volatile, and may vary over time.

Thus, there is a need in the art to reliably and properly integrate switches with various types of resonators and/or various types of MEMS in semiconductor chips.

SUMMARY

The present disclosure is directed to a semiconductor chip or system, such as a multi-chip module (MCM), a system-in-package (SiP), and/or a printed circuit board (PCB) module, having phase-change material (PCM) switches integrated with micro-electrical-mechanical systems (MEMS) and/or resonators, substantially as shown in and/or described in connection with at least one of the figures, and as set forth in the claims.

BRIEF DESCRIPTION OF THE DRAWINGS

FIGS. 1A, 1B, and 1C illustrate diagrams of arrays of resonators and/or arrays of micro-electrical-mechanical systems (MEMS) according to one implementation of the present application.

FIGS. 2A, 2B, and 2C illustrate diagrams of arrays of resonators and/or arrays of MEMS according to one implementation of the present application.

DETAILED DESCRIPTION

Figure 3:
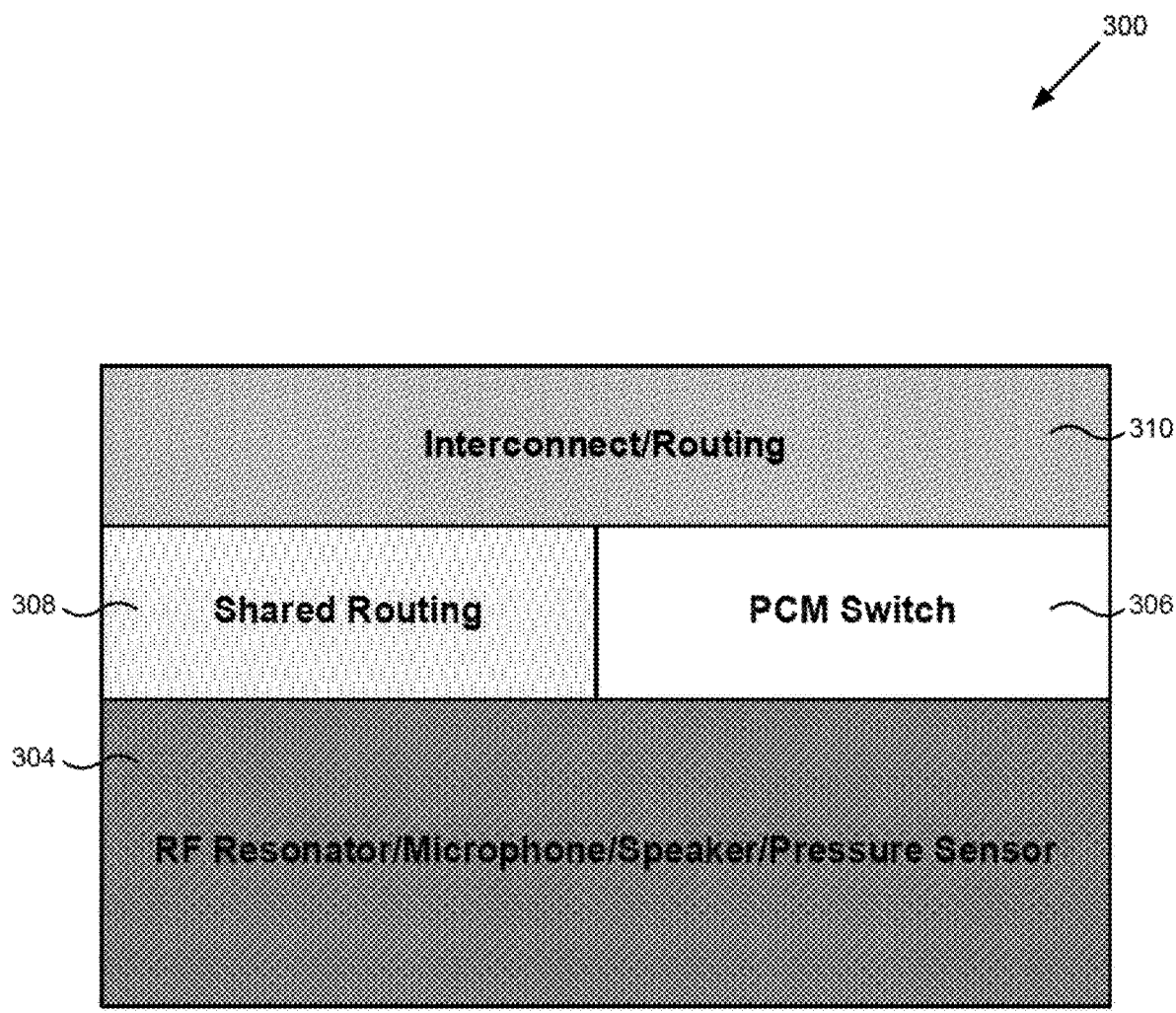
FIG. 3 illustrates a cross-sectional view of a portion of a semiconductor chip according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIGS. 1A, 1B, and 1C illustrate diagrams of arrays of resonators and/or arrays of micro-electrical-mechanical systems (MEMS) according to one implementation of the present application. Array 100 includes an array of elements 102. As described below, each element 102 includes a phase-change material (PCM) switch and a resonator and/or a MEMS. Elements 102 that are shaded indicate that a corresponding resonator and/or a corresponding MEMS is engaged. Similarly, elements 102 that are unshaded indicate that a corresponding resonator and/or a corresponding MEMS is disengaged.

In the present example, array 100 is an array of elements 102 arranged in a 7×7 grid pattern. However, as used in the present application, the term "array" simply refers to a group, and does not require any particular physical or geometrical ordering of elements 102. Moreover, in various implementations, array 100 can be of any size, and can have more or fewer elements 102, and elements 102 can be arranged in any other manner. Although elements 102 are illustrated as identical to each other in FIGS. 1A, 1B, and 1C, PCM switches and resonators and/or MEMS of elements 102 may have different characteristics (e.g., different breakdown voltages, different dimensions, different sensitivities, etc.)

By way of one illustrative example, FIGS. 1A, 1B and 1C illustrate implementations suitable for an array of MEMS microphones. As shown in FIG. 1A, in each corner of array 100, four elements 102 are engaged (shown as shaded elements 102). With these MEMS microphones engaged, array 100 in FIG. 1A may be configured for multi-directional listening. As shown in FIG. 1B, array 100 has been reconfigured. Three columns of MEMS microphones on the left side of array 100 are engaged. With these elements engaged, array 100 in FIG. 1B may be reconfigured for uni-directional listening. As shown in FIG. 1C, array 100 has again been reconfigured. The majority of MEMS microphones of array 100 are engaged, and the engaged MEMS microphones 102 from a substantially circular pattern. With these MEMS microphones engaged, array 100 in FIG. 1C may be reconfigured for omni-directional listening. As described below, the present application's inventive PCM switches integrated with various types of MEMS, for example MEMS microphones, are capable of reconfiguring array 100 as shown in FIGS. 1A, 1B, and 1C with low insertion low and high reliability.

By way of another illustrative example, FIGS. 2A, 2B, and 2C illustrate diagrams of arrays of resonators and/or arrays of MEMS according to one implementation of the present application. Array 200 includes an array of elements 202. As described below, each element 202 includes a phase-change material PCM switch and a resonator and/or a MEMS. Elements 202 that are shaded indicate that a corresponding resonator and/or a corresponding MEMS is engaged. Similarly, elements 202 that are unshaded indicate that a corresponding resonator and/or a corresponding MEMS is disengaged.

Array 200 shows eight elements 202 arranged in a 4×2 grid pattern. However, as used in the present application, the term "array" simply refers to a group, and does not require any particular geometry, positioning, or ordering of elements 202. In various implementations, array 200 can have more or fewer elements 202, and elements 202 can be arranged in any other manner. Although elements 202 are illustrated as identical to each other in FIGS. 2A, 2B, and 2C, PCM switches and resonators and/or MEMS of elements 202 may have different characteristics (e.g., different breakdown voltages, different dimensions, different sensitivities, etc.)

As one example, FIGS. 2A, 2B and 2C illustrate implementations suitable for arrays of resonators functioning as radio frequency (RF) filters. As shown in FIG. 2A, a single RF filter 202 is engaged. With this RF filter engaged, array 200 in FIG. 2A may be configured for narrow band-pass filtering. As shown in FIG. 2B, array 200 has been reconfigured. Four RF filters 202 (two RF filters 202 (shown as shaded) in the first row and two RF filters 202 (shown as shaded) in the fourth row) of array 200 are engaged. With these elements engaged, array 200 in FIG. 2B may be reconfigured for multi-band-pass filtering. As shown in FIG. 1C, array 200 has again been reconfigured. Four RF filters 202 (two RF filters 202 (shown as shaded) in the second row and two RF filters 202 (shown as shaded) in the third row) of array 200 are engaged. With these elements engaged, array 200 in FIG. 2C may be reconfigured for wide band-pass filtering. As described below, the present application's inventive PCM switches integrated with various types of resonators (i.e. RF filters) are capable of reconfiguring array 200 as shown in FIGS. 2A, 2B, and 2C with low insertion low and high reliability.

FIG. 3 illustrates a cross-sectional view of a portion of a semiconductor chip according to one implementation of the present application. In the present application, the term "semiconductor chip" is used as a short-hand reference, and is intended to define and refer to a monolithic semiconductor chip, a multi-chip module (MCM), a system-in-package (SiP), a printed circuit board (PCB) module, and/or any of their combinations collectively. In other words, so long as the inventive and novel PCM RF switch of the present application described below is combined with various MEMS and/or resonators to form a circuit or system, the specific choices in implementing the resulting novel circuit and system is not dependent on whether a monolithic semiconductor chip, a multi-chip module (MCM), a system-in-package (SiP), a printed circuit board (PCB) module, or any of their combinations are used, and whether the PCM RF switches reside in the same substrates or chips as the MEMS and/or resonators that are connected to the PCM RF switches. Further, as used in the present application, "semiconductor chip" or similar terms may refer to one or more dies, and the term "chip" is not intended to require any packaging or protective structures around the semiconductor die or dies; although semiconductor chip may also refer to a packaged semiconductor die or dies.

Semiconductor chip 300 in FIG. 3 includes resonator (e.g., RF filter) and/or MEMS (e.g., microphones, speakers, pressure sensors) 304, PCM switch 306, shared routing region 308, and interconnect/routing region 310. Resonator and/or MEMS 304 can be any resonator or MEMS known in the art. Resonator and/or MEMS 304 is shown as an RF resonator, a microphone, a speaker, or a pressure sensor in FIG. 3 by way of examples. For example, resonator and/or MEMS 304 can be a bulk acoustic wave (BAW) resonator. In this example, resonator and/or MEMS 304 can act, for example, as a filter or oscillator resonating at a desired frequency. For another example, resonator and/or MEMS 304 can be a capacitive MEMS microphone. In this example, resonator and/or MEMS 304 can convert sound waves into electrical signals. Resonator and/or MEMS 304 typically includes a substrate (not shown in FIG. 3). In one implementation, resonator and/or MEMS 304 can include an inlet for receiving environmental input, such as sound, pressure, or gas, through the top or bottom of semiconductor chip 300. In one implementation, resonator and/or MEMS 304 can include a sealed cavity. For example, a cavity of resonator and/or MEMS 304 can be covered by a thin film, over which PCM switch 306 or shared routing region 308 are situated.

PCM switch 306 is situated over resonator and/or MEMS 304. Additional details regarding PCM switch 306 are described below. Shared routing region 308 is situated over resonator and/or MEMS 304 adjacent to PCM switch 306. Shared routing region 308 is a region for electrical connections shared by resonator and/or MEMS 304 and PCM switch 306. As described below, a PCM contact (not shown in FIG. 3) of PCM switch 306 is electrically connected to resonator and/or MEMS 304 in shared routing region 308 to provide signals to and from resonator and/or MEMS 304. In one implementation, shared routing region 308 can comprise a plurality of interconnect metal levels and interlayer dielectric layers.

Interconnect/routing region 310 is situated over PCM switch 306 and shared routing region 308. Interconnect/routing region 310 provides additional connection for semiconductor chip 300. For example, interconnect/routing region 310 can comprise integrated passive devices (IPDs) electrically connected to PCM switch 306 and/or resonator and/or MEMS 304. Interconnect/routing region 310 can also provide external connections, such as connections to an RF source, a microcontroller unit (MCU), or an application specific integrated circuit (ASIC), for PCM switch 306 and/or resonator and/or MEMS 304. In various implementations, interconnect/routing region 310 can comprise a plurality of interconnect metal levels and interlayer dielectric layers, a redistribution layer, and/or pad openings.

Figure 4A:
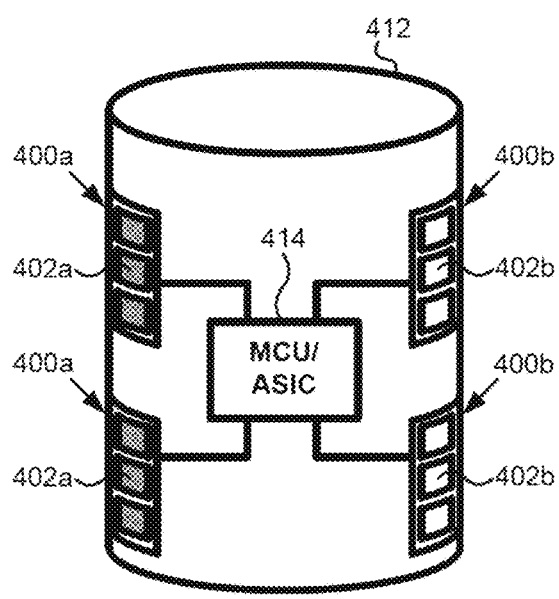
FIGS. 4A and 4B illustrate consumer electronic devices including MEMS microphone arrays according to one implementation of the present application.
Figure 4B:
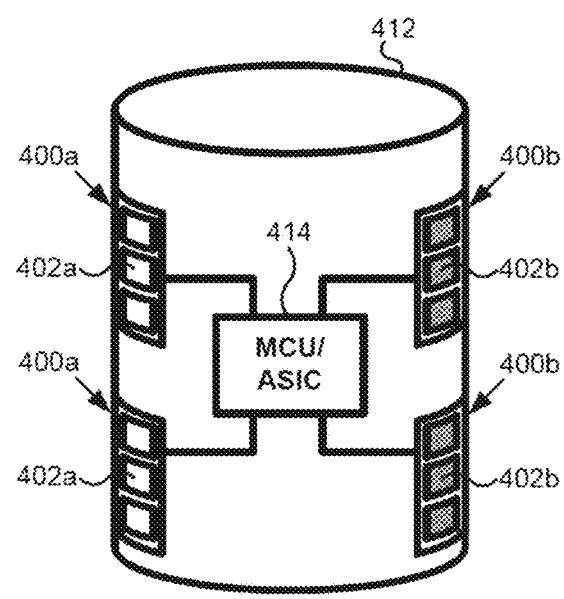

FIGS. 4A and 4B illustrate consumer electronic devices including MEMS microphone arrays according to one implementation of the present application, and serve as illustrative examples. Consumer electronic device 412 includes MEMS microphone arrays 400a, MEMS microphone arrays 400b, and MCU/ASIC 414. Consumer electronic device 412 can be any consumer electronic device, such as a speaker tower, a mobile phone, etc. MEMS microphone arrays 400a are situated on the left side of consumer electronic device 412, and are connect to MCU/ASIC 414. Similarly, MEMS microphone arrays 400b are situated on the right side of consumer electronic device 412, and are connected to MCU/ASIC 414. In the present implementation, each of MEMS microphone arrays 400a and 400b includes three elements (e.g., three MEMS microphones) 402a or 402b respectively. One of elements 402a or 402b in FIGS. 4A and 4B generally corresponds to one of elements 102 in FIGS. 1A, 1B, and 1C, and may have any implementations or advantages described above.

In the example of FIG. 4A, MEMS microphones 402a of arrays 400a are engaged (shaded), and MEMS microphones 402b of arrays 400b are disengaged (unshaded). As shown in FIG. 4B, MEMS microphone arrays 400a and 400b have been reconfigured. MEMS microphones 402a of arrays 400a are disengaged (unshaded), and MEMS microphones 402b of arrays 400b are engaged (shaded). As used herein, "engaged" refers to a resonator and/or MEMS having a very low resistance electrical connection to other parts of a circuit through a connecting PCM switch, i.e. when the PCM switch in the path of the resonator and/or MEMS is in an ON (very low resistance) stare. Further, "disengaged" refers to when the PCM switch is in an OFF (very high resistance) state.

Consumer electronic device 412 may be reconfigured in response to reconfiguration control signals from MCU/ASIC 414. Individual MEMS microphones 402a and 402b of arrays 400a and 400b can be engaged or disengaged in any combination in response to reconfiguration control signals from MCU/ASIC 414. For example, when consumer electronic device 412 is reconfigured as shown in FIG. 4B, one or more of MEMS microphones 402a could remain engaged.

Figure 5:
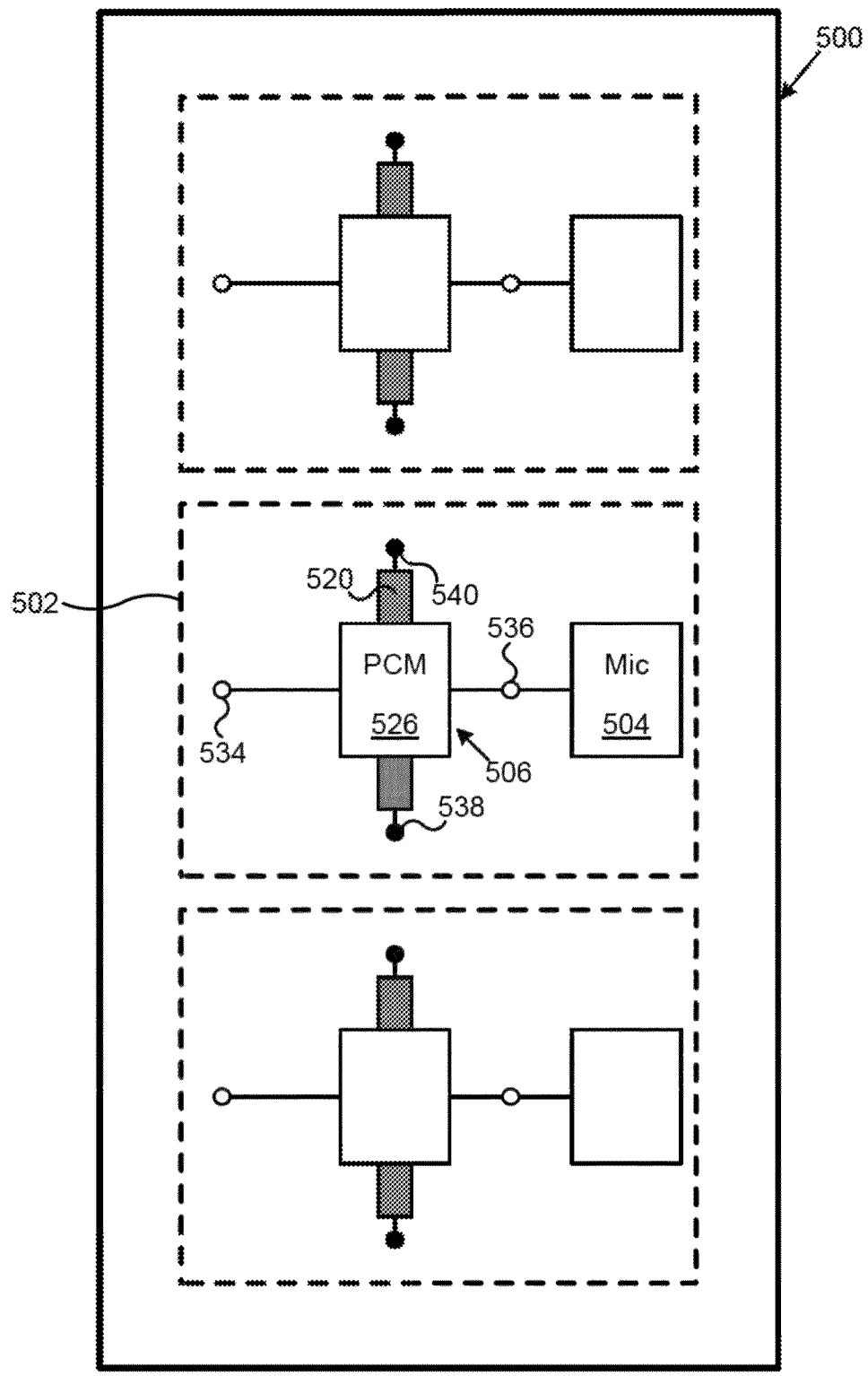
FIG. 5 illustrates a portion of a MEMS microphone array according to one implementation of the present application.

FIG. 5 illustrates a portion of a MEMS microphone array according to one implementation of the present application. MEMS microphone array 500 includes elements 502. Each element 502 includes PCM switch 506 and MEMS microphone 504. One of elements 502 can generally correspond to one of elements 402a or 402b in FIGS. 4A and 4B or to one of elements 102 in FIGS. 1A, 1B, and 1C, and may have any implementations or advantages described above.

PCM switch 506 includes heating element 520, PCM 526, PCM contacts 534 and 536, and heater contacts 538 and 540. PCM 526 is situated over heating element 520. As described below, heater contacts 538 and 540 provide power to heating element 520 for generating a crystallizing heat pulse or an amorphizing heat pulse for transforming an active segment of PCM 526 between crystalline and amorphous phases, thereby switching PCM switch 506 between ON and OFF states respectively. Heater contacts 538 and 540 can be connected to electrodes of a pulse generator (not shown in FIG. 5) that generates crystallizing or amorphizing voltage or current pulses. For example, heater contact 538 can be connected to a pulse generator and heater contact 540 can be connected to ground. In one implementation, the pulse generator can be integrated with an MCU/ASIC, such as MCU/ASIC 414 in FIG. 4.

PCM contact 536 is connected to MEMS microphone 504. When PCM switch 506 is in an ON state, PCM 526 is in a crystalline phase, has low resistivity, and is able to easily conduct electrical current. A signal from MEMS microphone 504 propagates across PCM switch 506 along a path from PCM contact 536, through PCM 526, to PCM contact 534. Accordingly, when PCM switch 506 is in an ON state, PCM switch 506 engages MEMS microphone 504. PCM contact 534 can be connected to, for example, an MCU/ASIC, IPDs, or other analysis circuitry (not shown in FIG. 5) for receiving signals from MEMS microphone 504.

When PCM switch 506 is in an OFF state, an active segment of PCM 526 is in an amorphous phase, has high resistivity, and does not easily conduct electrical current. A signal from MEMS microphone 504 does not propagates across PCM switch 506 along a path from PCM contact 536, through PCM 526, to PCM contact 534. Accordingly, when PCM switch 506 is in an OFF state, PCM switch 506 disengages MEMS microphone 504. Thus, PCM switches 506 are capable of reconfiguring MEMS microphone array 500. Additional details regarding PCM switch 506 and MEMS microphone 504 are described below.

Figure 6:
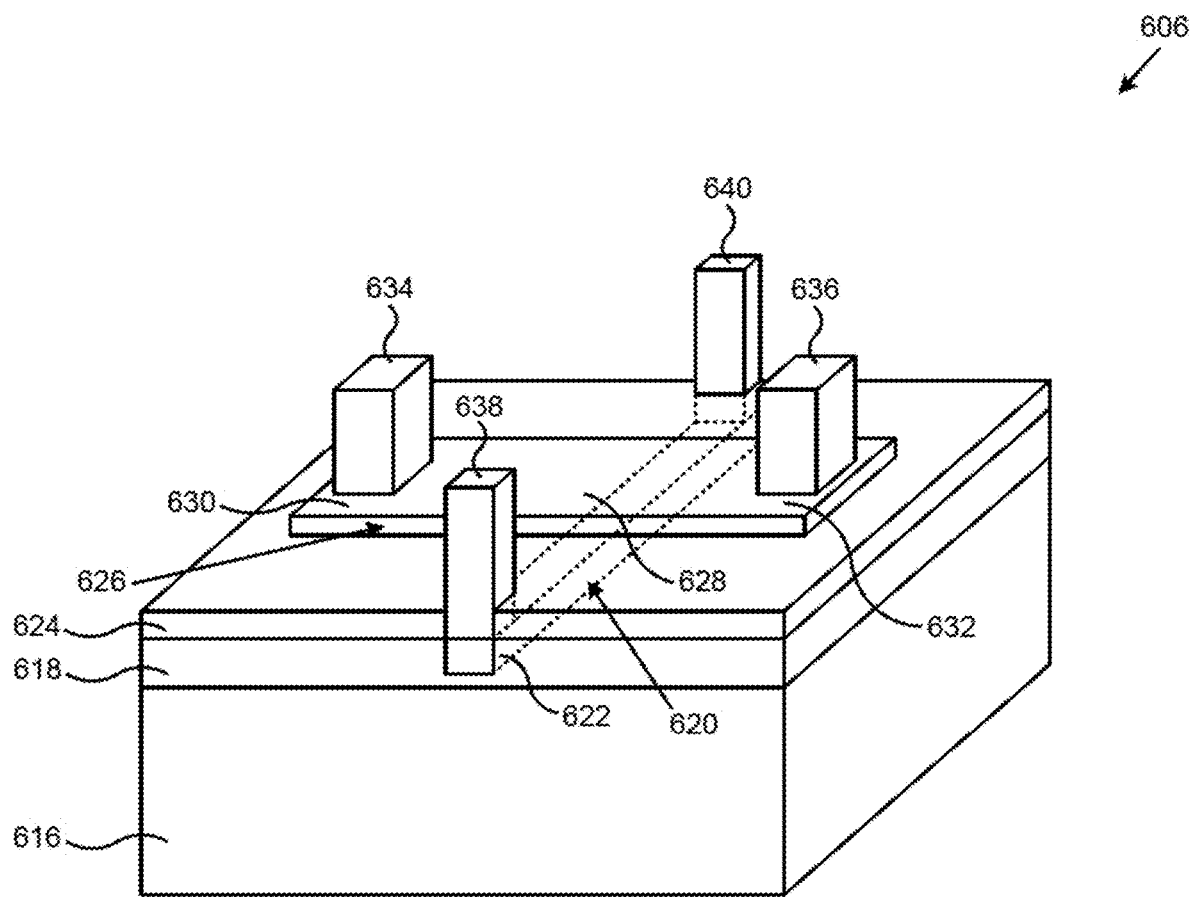
FIG. 6 illustrates a perspective view of a portion of a PCM switch according to one implementation of the present application.

FIG. 6 illustrates a perspective view of a portion of a PCM switch according to one implementation of the present application. PCM switch 606 in FIG. 6 generally corresponds to PCM switch 306 in FIG. 3 and to PCM switch 506 in FIG. 5. As shown in FIG. 6, PCM switch 606 includes base 616, dielectric layer 618, heating element 620 having terminal segments 622, thermally conductive and electrically insulating material 624, PCM 626 having active segment 628 and passive segments 630 and 632, PCM contacts 634 and 636, and heater contacts 638 and 640. For purposes of illustration, the perspective view in FIG. 6 shows selected structures of PCM switch 606. PCM switch 606 may include other structures not shown in FIG. 6.

Base 616 is situated under dielectric layer 618. In one implementation, base 616 is an insulator, such as silicon oxide ($SiO_2$). In various implementations, base 616 comprises silicon (Si). In various implementations, base 616 includes a heat spreader or base 616 itself performs as a heat spreader. Base 616 can have additional layers (not shown in FIG. 6). In one implementation, base 616 in FIG. 6 can be a layer shared with shared routing 308 in FIG. 3. In another implementation, base 616 in FIG. 6 can be a cap layer covering resonator and/or MEMS 304 in FIG. 3.

Dielectric layer 618 in PCM switch 606 is situated above base 616 and below thermally conductive and electrically insulating material 624. As shown in FIG. 6, dielectric layer 618 is also adjacent to sides of heating element 620. Dielectric layer 618 extends along the width of PCM switch 606, and is also coplanar with the top of heating element 620. Because PCM switch 606 includes dielectric layer 618 on the sides of heating element 620, less heat transfers horizontally (i.e., from the sides) and more heat dissipates vertically, from heating element 620 toward active segment 628 of PCM 626. In various implementations, dielectric layer 618 can have a relative width and/or a relative thickness greater or less than shown in FIG. 6. Dielectric layer 618 can comprise any material with thermal conductivity lower than that of thermally conductive and electrically insulating material 624.

Heating element 620 in PCM switch 606 is situated in dielectric layer 618. Heating element 620 also approximately defines active segment 628 of PCM 626. Heating element 620 generates a crystallizing heat pulse or an amorphizing heat pulse for transforming active segment 628 of PCM 626. Heating element 620 can comprise any material capable of Joule heating. Heating element 620 can be connected to electrodes of a pulse generator (not shown in FIG. 6) that generates crystallizing or amorphizing voltage or current pulses. Preferably, heating element 620 comprises a material that exhibits minimal or substantially no electromigration, thermal stress migration, and/or agglomeration. In various implementations, heating element 620 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). For example, in one implementation, hearing element 620 comprises tungsten lined with titanium and titanium nitride.

Thermally conductive and electrically insulating material 624 in PCM switch 606 is situated on top of heating element 620 and dielectric layer 618, and under PCM 626 and, in particular, under active segment 628 of PCM 626. Thermally conductive and electrically insulating material 624 ensures efficient heat transfer from heating element 620 toward active segment 628 of PCM 626, while electrically insulating heating element 620 from PCM contacts 634 and 636, PCM 626, and other neighboring structures.

Thermally conductive and electrically insulating material 624 can comprise any material with high thermal conductivity and high electrical resistivity. In various implementations, thermally conductive and electrically insulating material 624 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 624 can be a nugget that does not extend along the width of PCM switch 606. For example, thermally conductive and electrically insulating material 624 can be a nugget approximately aligned with heating element 620.

PCM 626 in PCM switch 606 is situated on top of thermally conductive and electrically insulating material 624. PCM 626 includes active segment 628 and passive segments 630 and 632. Active segment 628 of PCM 626 is approximately defined by heating element 620. Passive segments 630 and 63 of PCM 626 extend outward and are transverse to heating element 620, and are situated approximately under PCM contacts 634 and 636 respectively. As used herein, "active segment" refers to a segment of PCM that transforms between crystalline and amorphous phases, for example, in response to a crystallizing or an amorphizing heat pulse generated by heating element 620, whereas "passive segment" refers to a segment of PCM that does not make such transformation and maintains a crystalline phase (i.e., maintains a conductive state).

With proper heat pulses and heat dissipation, active segment 628 of PCM 626 can transform between crystalline and amorphous phases, allowing PCM switch 606 to switch between ON and OFF states respectively. Active segment 628 of PCM 626 must be heated and rapidly quenched in order for PCM switch 606 to switch states. If active segment 628 of PCM 626 does not quench rapidly enough, it will not transform and PCM switch 606 will fail to switch states. How rapidly active segment 628 of PCM 626 must be quenched depends on the material, volume, and temperature of PCM 626. In one implementation, the quench time window can be approximately one hundred nanoseconds (100 ns) or greater or less.

PCM 626 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 626 can be germanium telluride having from forty percent to sixty percent germanium by composition (i.e., $Ge_XTe_Y$, where $0.4 \leq X \leq 0.6$ and $Y=1-X$). The material for PCM 626 can be chosen based upon ON state resistivity, OFF state electric field breakdown voltage, crystallization temperature, melting temperature, or other considerations. It is noted that in FIG. 6, heating element 620 is transverse to PCM 626. Heating element 620 is illustrated with dashed lines as seen through various structures of PCM switch 606. Current flowing in heating element 620 flows substantially under active segment 628 of PCM 626.

PCM contacts 634 and 636 in PCM switch 606 are connected to passive segments 630 and 632 respectively of PCM 626. Similarly, heater contacts 638 and 640 are connected to terminal segments 622 of heating element 620. PCM contacts 634 and 636 provide signals to and from PCM 626. As described above, one of PCM contacts 634 and 636 in FIG. 6 is electrically connected to resonator and/or MEMS 304 in FIG. 3 in shared routing region 308. As described above, another one of PCM contacts 634 and 636 in FIG. 6 can be electrically connected to an MCU, an ASIC, or an RF source. Heater contacts 638 and 640 provide power to heating element 620 for generating a crystallizing heat pulse or an amorphizing heat pulse. PCM contacts 634 and 636 and heater contacts 638 and 640 can extend through various dielectric layers (not shown in FIG. 6). In various implementations, PCM contacts 634 and 636 and heater contacts 638 and 640 can comprise tungsten (W), copper (Cu), or aluminum (Al).

Figure 7:
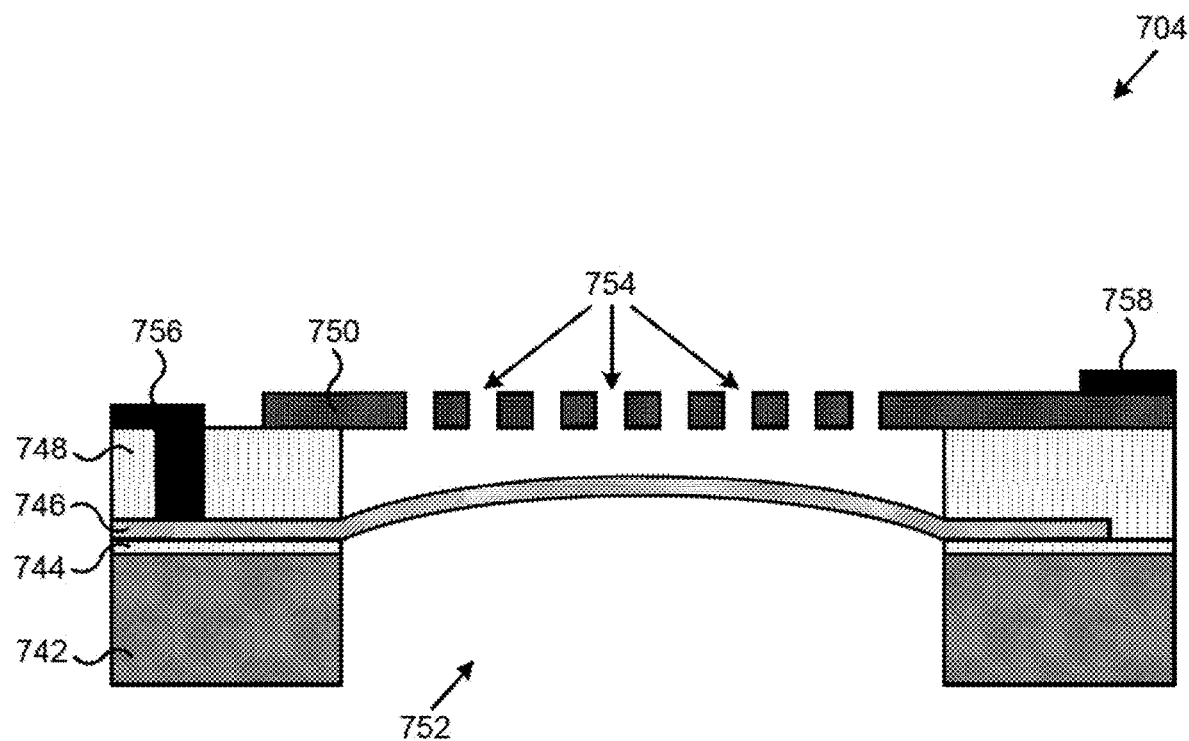
FIG. 7 illustrates a cross-sectional view of an example of a MEMS microphone that can be used in one implementation of the present application.

FIG. 7 illustrates a cross-sectional view of an example of a MEMS microphone that can be used in one implementation of the present application. It is noted that FIG. 7 is merely one out of many possible representative drawings to address and discuss a type of MEMS, i.e. a MEMS microphone and is, moreover, merely a conceptual representation of such a MEMS microphone, that can be used in one implementation of the present application. It is appreciated that one of ordinary skill in the art understands that the conceptual representation of a MEMS microphone in FIG. 7 is merely for discussion purposes and to more concretely describe utilization of the present application's novel and inventive concepts in integrating PCM RF switches with various types of MEMS in various monolithic and/or multi-chip system solutions. As such, many different types of MEMS, and specifically many different examples of MEMS microphones, may be used in various implementations of the present application. For the purpose of the present application, and in order to maintain focus on its inventive concepts, illustrations of all details normally present in various types of MEMS or MEMS microphones are avoided. MEMS microphone 704 in FIG. 7 generally corresponds to resonator and/or MEMS 304 in FIG. 3 and to MEMS microphone 504 in FIG. 5. As shown in FIG. 7, MEMS microphone 704 includes substrate 742, first dielectric layer 744, conductive membrane 746, second dielectric layer 748, conductive backplate 750, cavity 752, acoustic holes 754 and contacts/interconnects 756 and 758.

Substrate 742 is situated under first dielectric layer 744. In various implementations, substrate 742 is a silicon (Si) or silicon-on-insulator (SOI) substrate. First dielectric layer 744 is situated over substrate 742 and under conductive membrane 746. First dielectric layer 744 electrically insulates substrate 742 from conductive membrane 746. In various implementations, first dielectric layer 744 can comprise silicon oxide ($SiO_2$), silicon nitride ($Si_xN_y$), or another dielectric. Conductive membrane 746 is situated over first dielectric layer 744, and extends across cavity 752. Conductive membrane 746 is sensitive to sound and vibrates in response to a sound wave in cavity 752. Conductive membrane 746 may have vent holes in another plane not visible in the cross-sectional view of FIG. 7.

Second dielectric layer 748 is situated over conductive membrane 746. Second dielectric layer 748 electrically insulates conductive membrane 746 from conductive backplate 750, and provides room for conductive membrane 746 to vibrate. In various implementations, second dielectric layer 748 can comprise silicon oxide ($SiO_2$), silicon nitride ($Si_xN_y$), or another dielectric. Conductive backplate 750 is situated over second dielectric layer 748, and extends across cavity 752. Conductive backplate 750 includes acoustic holes 754 that allow airflow to pass through. Hence, conductive backplate 750 is generally insensitive to a sound wave in cavity 752. In various implementations, conductive backplate 750 can comprise aluminum (Al), tungsten (W), molybdenum (Mo), or platinum (Pt).

Conductive membrane 746 and conductive backplate 750 act as plates of a capacitor with air in cavity 752 between conductive membrane 746 and conductive backplate 750 providing the dielectric of the capacitor. The movement of conductive membrane 746 changes the capacitance. This change in capacitance can be translated into an electrical signal by external circuitry. MEMS microphone 704 includes contacts/interconnects 756 and 758 connected to conductive membrane 746 and conductive backplate 750 respectively for providing electrical connections. For example, contact/interconnect 756 in FIG. 7 can be connected to PCM contact 636 in FIG. 6 in shared routing region 308 in FIG. 3, and contact/interconnect 756 in FIG. 7 can be connected to an MCU/ASIC 414 in FIG. 4 through interconnect/routing region 310 in FIG. 3. Notably, MEMS microphone 704 is merely exemplary and can be any other type of MEMS microphone.

Figure 8:
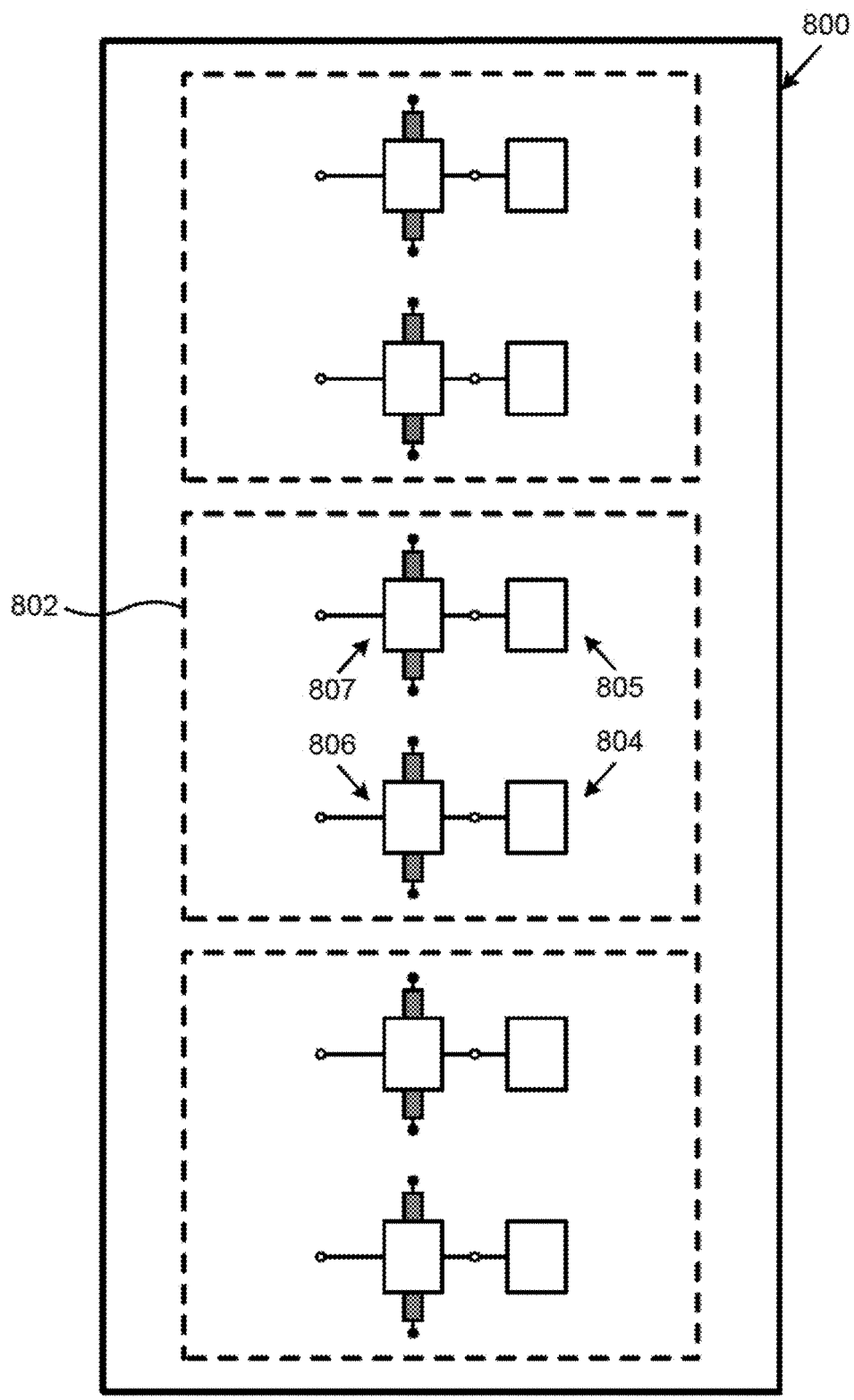
FIG. 8 illustrates a portion of a MEMS microphone array according to one implementation of the present application.

FIG. 8 illustrates a portion of a MEMS microphone array according to one implementation of the present application. MEMS microphone array 800 includes elements 802. Each of elements 802 includes MEMS microphone 804, substantially co-located MEMS microphone 805, and PCM switches 806 and 807. One of elements 802 generally corresponds to one of elements 402a or 402b in FIGS. 4A and 4B or to one of elements 102 in FIGS. 1A, 1B, and 1C, and may have any implementations or advantages described above.

In MEMS microphone array 800, PCM switch 806 is configured to engage and disengage MEMS microphone 804. Similarly, PCM switch 807 is configured to engage and disengage substantially co-located MEMS microphone 805. Where MEMS microphone 804 and substantially co-located MEMS microphone 805 receive substantially the same input sound wave, PCM switch 806 and PCM switch 807 can be engaged simultaneously and can each provide an averaging signal to an MCU/ASIC or analysis circuitry for averaging. Thus, MEMS microphone array 800 increases measurement accuracy.

Notably, including PCM switches 807 to provide averaging signals as shown in FIG. 8 effectively doubles the number of switches used by MEMS microphone array 800. In a conventional microphone array, doubling the number of switches used can increase the insertion loss to the point where the microphone array no longer functions as intended. First, in a conventional microphone array, conventional switches may be implemented on a first die, MEMS microphones may be implemented on a second die, and the two dies may be flip-chip bonded or wire bonded. Flip-chip bonding and wire bonding typically involve large connectors having relatively large resistances. Second, conventional switches can have higher ON state resistances ($R_{ON}$) than PCM switches. Third, conventional switches are typically volatile, and vary over time. Conventional switches can thus draw power even when they are not actively changing states. In an array having a large number of elements, and having two switches per element for averaging purposes, higher connector resistances, higher $R_{ON}$, and volatility significantly increase total insertion loss.

Because MEMS microphone array 800 employs PCM switches 806 and 807 electrically connected to MEMS microphones 804 and 805 in a shared interconnect/routing region 308 (shown in FIG. 3), connector resistances are relatively low. Moreover, because MEMS microphone array 800 employs PCM switches 806 and 807 utilizing low-resistivity PCM 626 (shown in FIG. 6) to provide signals, $R_{ON}$ is also relatively low. For example, in one implementation, $R_{ON}$ of PCM switches 806 and 807 can be approximately one Ohm (1Ω) or less. Further, because PCM switches 806 and 807 are non-volatile, they will not draw power after a crystallizing heat pulse or an amorphizing heat pulse transforms active segment 628 of PCM 626 (i.e., they will not draw power after they are switched between ON and OFF states). Accordingly, MEMS microphone array 800 can use additional PCM switches 807 in each element 802 for averaging and increased accuracy, without significant insertion loss.

Figure 9:
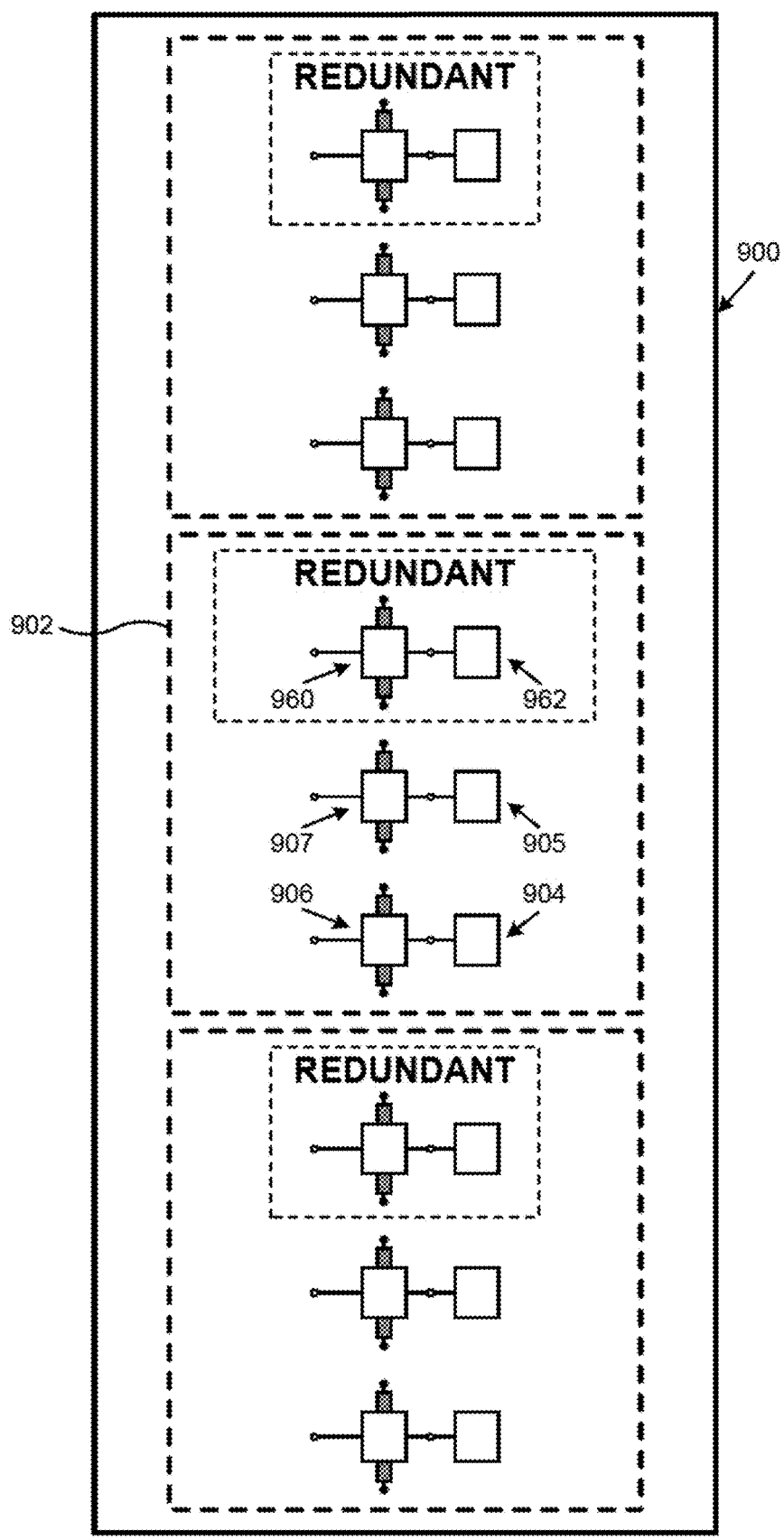
FIG. 9 illustrates a portion of a MEMS microphone array according to one implementation of the present application.

FIG. 9 illustrates a portion of a MEMS microphone array according to one implementation of the present application. MEMS microphone array 900 includes elements 902. Each of elements 902 includes primary MEMS microphones 904 and 905, redundant MEMS microphone 962, primary PCM switches 906 and 907, and redundant PCM switch 960. One of elements 902 generally corresponds to one of elements 402a or 402b in FIGS. 4A and 4B or to one of elements 102 in FIGS. 1A, 1B, and 1C, and may have any implementations or advantages described above. Redundant PCM switch 960 generally has a structure corresponding to PCM switch 606 in FIG. 6.

In MEMS microphone array 900, primary PCM switches 906 and 907 are electrically connected to primary MEMS microphones 904 and 905 respectively. Redundant PCM switch 960 is electrically connected to redundant MEMS microphone 962. Primary MEMS microphones 904 and 905 and redundant MEMS microphone 962 are substantially co-located with each other in a semiconductor chip and receive substantially the same input sound wave. Redundant PCM switch 960 and redundant MEMS microphone 962 serve as alternatives to their primaries. As used in the present application, "primary resonator and/or primary MEMS" refers to a resonator and/or MEM that is engaged in normal operation, whereas "redundant resonator and/or redundant MEMS" refers to a resonator and/or MEM that is only engaged in exceptional or failed/faulty primary situations. Likewise, "primary PCM switch" refers to a PCM switch that engages in normal operation, whereas "redundant PCM switch" refers to a PCM switch that only engages in exceptional or failed/faulty primary situations.

For example, redundant PCM switch 960 can be configured to engage redundant MEMS microphone 962 in response to a fault in primary MEMS microphone 904 or in primary MEMS microphone 905. A fault can be detected, for example, by MCU/ASIC 414 in FIG. 4 or by other monitoring circuitry. Primary PCM switches 906 and 907 can also be configured to permanently disengage primary MEMS microphones 904 and 905 in response to a fault. Accordingly, MEMS microphone array 900 can use redundant PCM switches 960 in each element 902 to improve reliability against fault, without significantly increasing manufacturing cost or insertion loss.

Figure 10:
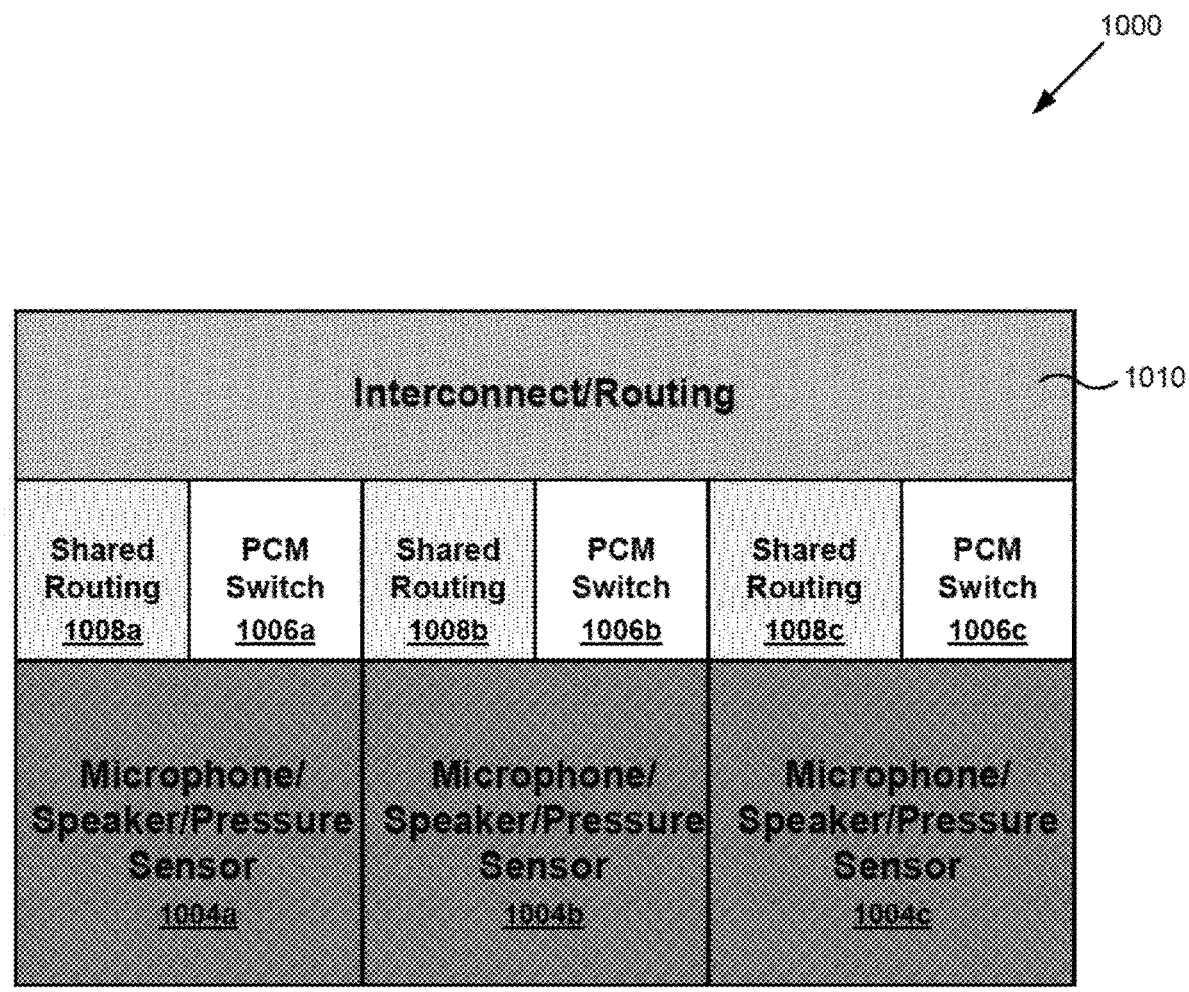
FIG. 10 illustrates a cross-sectional view of a portion of a semiconductor chip according to one implementation of the present application.

FIG. 10 illustrates a cross-sectional view of a portion of a semiconductor chip according to one implementation of the present application. As stated above, in the present application, the term "semiconductor chip" is used as a short-hand reference, and is intended to define and refer to a monolithic semiconductor chip, a multi-chip module (MCM), a system-in-package (SiP), a printed circuit board (PCB) module, and/or any of their combinations collectively. In other words, so long as the inventive and novel PCM RF switch of the present application described below is combined with various MEMS and/or resonators to form a circuit or system, the specific choices in implementing the resulting novel circuit and system is not dependent on whether a monolithic semiconductor chip, a multi-chip module (MCM), a system-in-package (SiP), a printed circuit board (PCB) module, or any of their combinations are used, and whether the PCM RF switches reside in the same substrates or chips as the MEMS and/or resonators that are connected to the PCM RF switches. Further, as used in the present application, "semiconductor chip" or similar terms may refer to one or more dies, and the term "chip" is not intended to require any packaging or protective structures around the semiconductor die or dies; although semiconductor chip may also refer to a packaged semiconductor die or dies.

Semiconductor chip 1000 in FIG. 10 includes MEMS 1004a, 1004b, and 1004c, PCM switches 1006a, 1006b, and 1006c, shared routing regions 1008a, 1008b, and 1008c, and interconnect/routing region 1010. MEMS 1004a, 1004b, and 1004c can be any MEMS known in the art, and are shown as microphones, speakers, or pressure sensors in FIG. 10 by way of examples. Semiconductor chip 1000 in FIG. 10 generally illustrates how MEMS 1004a, 1004b, and 1004c can be substantially co-located in a single chip while still electrically connecting to PCM switches 1006a, 1006b, and 1006c in shared routing regions 1008a, 1008b, and 1008c. For example, MEMS 1004a and PCM switch 1006a in FIG. 10 may correspond to primary MEMS microphone 904 and primary PCM switch 906 in FIG. 9, MEMS 1004b and PCM switch 1006b in FIG. 10 may correspond to primary MEMS microphone 905 and primary PCM switch 907 in FIG. 9, and MEMS 1004c and PCM switch 1006c in FIG. 10 may correspond to redundant MEMS microphone 962 and redundant PCM switch 960 in FIG. 9. Interconnect/routing region 1010 in FIG. 10 generally corresponds to interconnect/routing region 310 in FIG. 3.

Figure 11A:
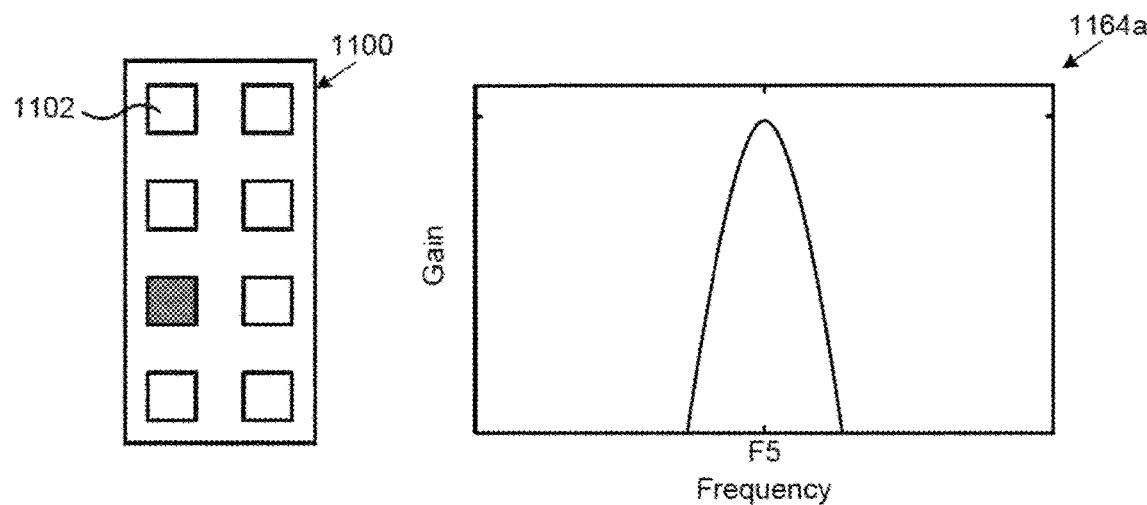
FIGS. 11A, 11B, and 11C illustrate diagrams of arrays of resonators and corresponding frequency response graphs according to one implementation of the present application.
Figure 11B:
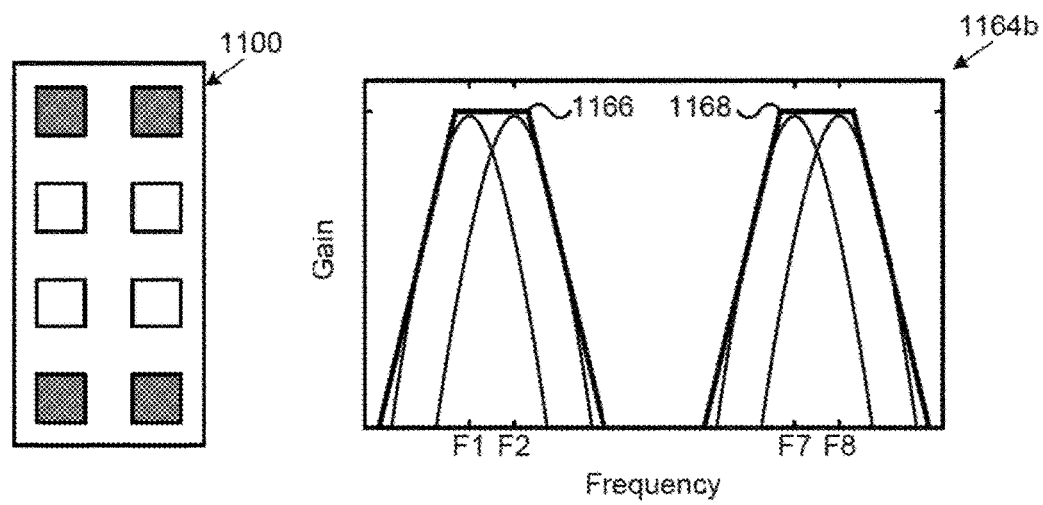
Figure 11C:
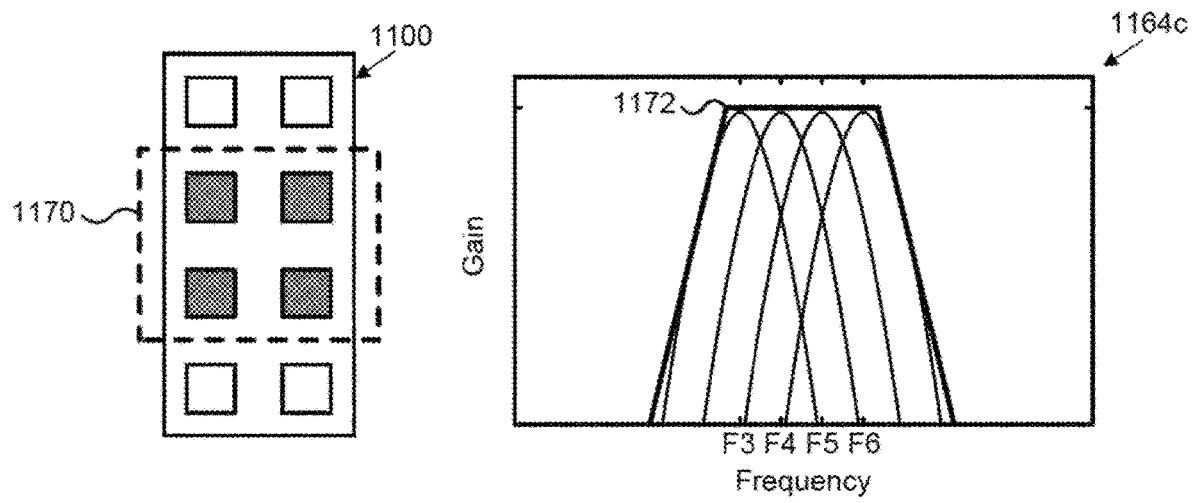

FIGS. 11A, 11B, and 11C illustrate diagrams of arrays of resonators and corresponding frequency response graphs according to one implementation of the present application. Resonator array 1100 includes elements 1102 functioning as RF filters. As described below, each element 1102 includes a PCM switch and a resonator. As shown in FIG. 11A, a single element 1102 (shaded) is engaged using a PCM switch. With this element engaged, resonator array 1100 in FIG. 11A may be configured for narrow band-pass filtering. Graph 1164a is a corresponding frequency response graph. As shown in graph 1164a, resonator array 1100 in FIG. 11A experiences a peak response around frequency F5 with a relatively narrow band.

As shown in FIG. 11B, resonator array 1100 has been reconfigured using PCM switches. Four of elements 1102 (two elements 1102 (shaded) in the first row and two elements 1102 (shaded) in the fourth row) of resonator array 1100 are engaged. With these elements engaged, resonator array 1100 in FIG. 2B may be reconfigured for multi-band-pass filtering. Graph 1164b is a corresponding frequency response graph. As shown in graph 1164b, resonator array 1100 in FIG. 11B experiences several peaks around frequencies F1, F2, F7, and F8. The peaks near frequencies F1 and F2 together form band 1166, which is wider relative to the band shown in graph 1164a in FIG. 11A. Likewise, the peaks near frequencies F7 and F8 form wider band 1168.

As shown in FIG. 11C, resonator array 1100 has again been reconfigured using PCM switches. Four of elements 1102 (two elements 1102 (shaded) in the second row and two elements 1102 (shaded) in the third row) of resonator array 1100 are engaged. These engaged elements are outlined as sub-array 1170. With these elements engaged, resonator array 1100 in FIG. 11C may be reconfigured for wide band-pass filtering. Graph 1164c is a corresponding frequency response graph. As shown in graph 1164c, resonator array 1100 in FIG. 11C experiences several peaks around frequencies F3, F4, F5, and F6. The peaks together form band 1172, which is wider relative to band 1166 or 1168 shown in graph 1164b in FIG. 11B.

Elements 1102 in FIGS. 11A, 11B, and 11C can have different frequency response characteristics from each other. In various implementations, the frequency responses can have peaks at frequencies other than those shown in FIGS. 11A, 11B, and 11C, can have sidelobes not shown in FIGS. 11A, 11B, 11C, and can have wider or narrower bands. Thus, by utilizing elements with different frequency response characteristics, resonator array 1100 can be reconfigured in various combinations to achieve a reconfigurable RF filter. Resonator array 1100 can include more or fewer elements 1102 than shown in FIGS. 11A, 11B, and 11C. Because resonator array 1100 has relatively low insertion loss, resonator array 1100 can include more elements for the same total insertion loss as a conventional resonator array. Accordingly, resonator array 1100 can be reconfigured in many more combinations and achieves improved reconfigurability. In one implementation, each element 1102 can include a primary resonator, a primary PCM switch, a redundant resonator, and a redundant PCM switch, and resonator array 1100 also achieves improved reliability.

Figure 12:
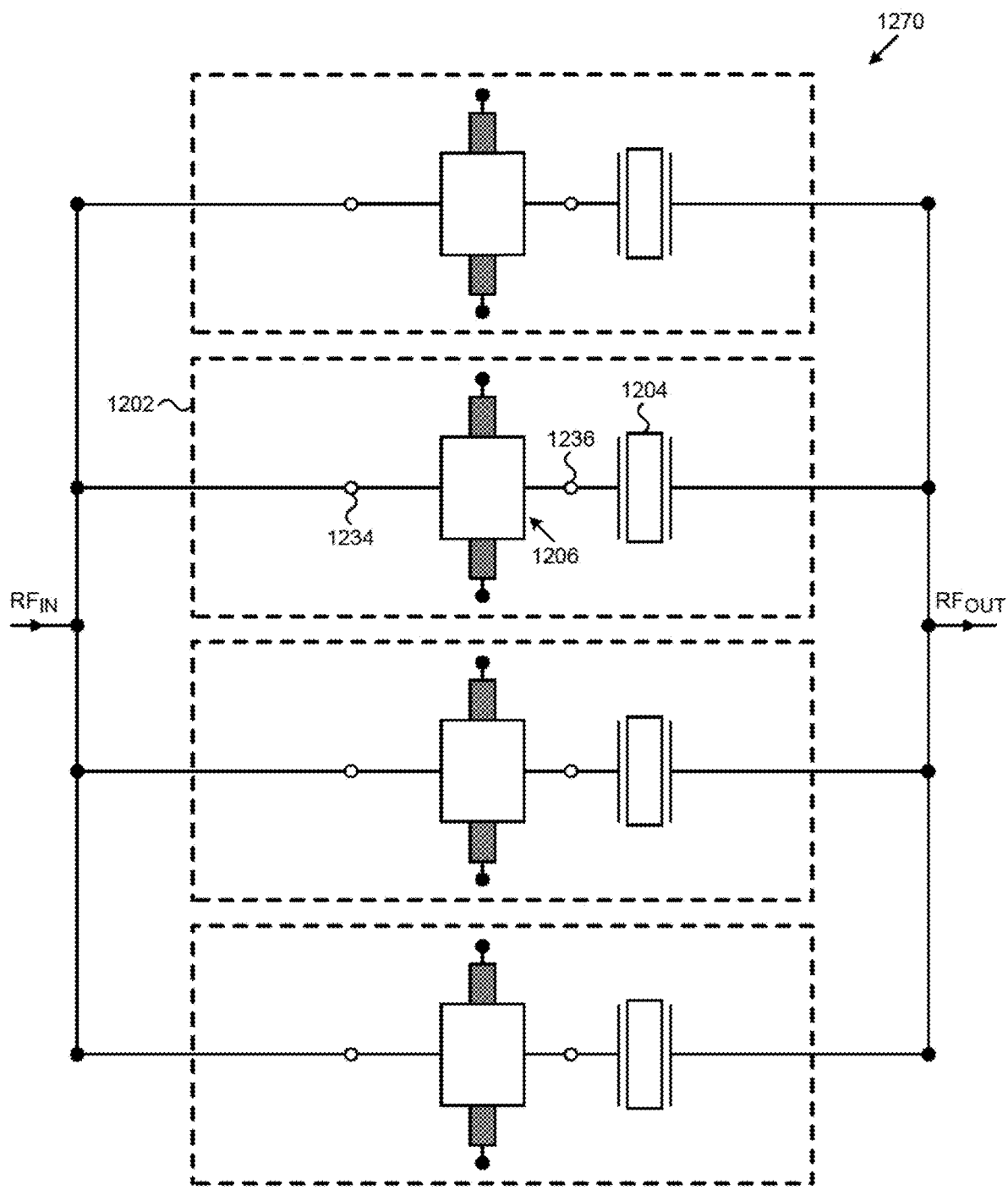
FIG. 12 illustrates a portion of array of resonators according to one implementation of the present application.

FIG. 12 illustrates a portion of a resonator array according to one implementation of the present application. Resonator array 1270 includes elements 1202. Each of elements 1202 includes PCM switch 1206 and resonator 1204. Resonator array 1270 generally corresponds to sub-array 1170 in FIG. 11C.

PCM contact 1234 of PCM switch 1206 is connected to an RF input $RF_{IN}$. PCM contact 1236 of PCM switch 1206 is connected to a first terminal of resonator 1204. A second terminal of resonator 1204 is connected to an RF output $RF_{OUT}$. When PCM switch 1206 is in an ON state, PCM switch 1206 engages resonator 1204, and resonator 1204 to a signal at $RF_{IN}$. When PCM switch 1206 is in an OFF state, PCM switch 1206 disengages resonator 1204. Thus, PCM switches 1206 are capable of reconfiguring resonator array 1270, $RF_{OUT}$ can be connected to, for example, an MCU/ASIC, IPDs, or other circuitry (not shown in FIG. 12) for receiving signals from resonator 1204.

Figure 13A:
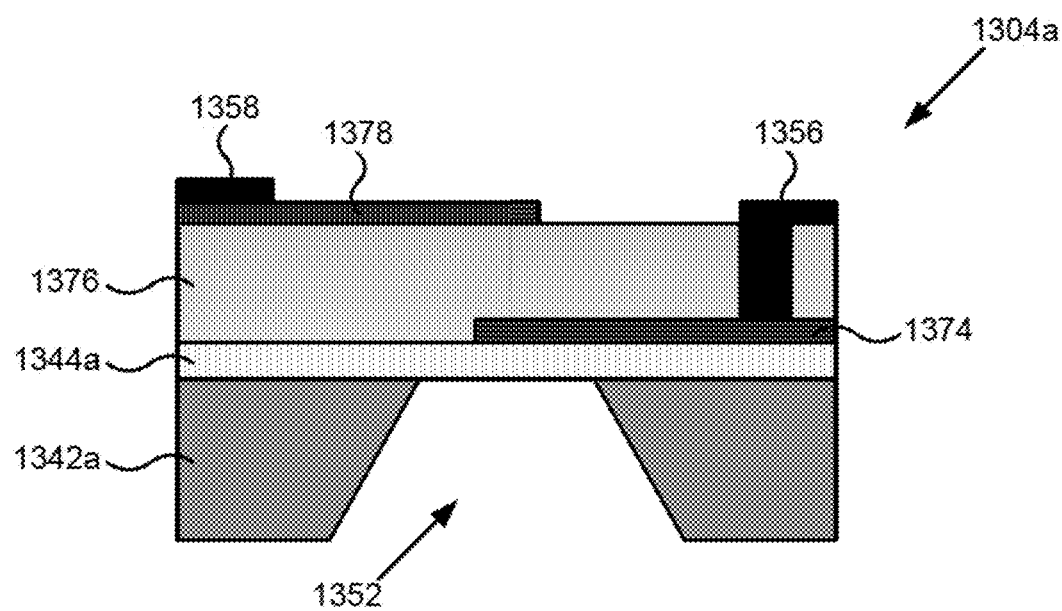
FIGS. 13A and 13B illustrate cross-sectional views of examples of resonators that can be used in various implementations of the present application.
Figure 13B:
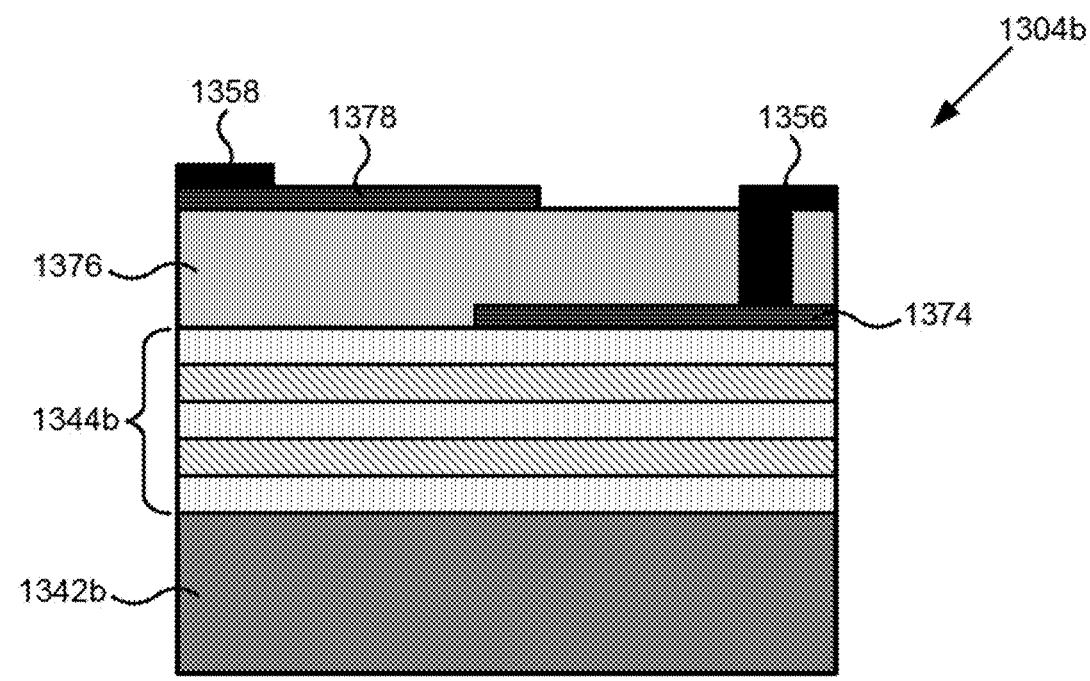

FIGS. 13A and 13B illustrate cross-sectional views of exemplary resonators that can be used in various implementations of the present application. It is noted that FIGS. 13A and 13B are merely two out of many possible representative drawings to address and discuss two types of resonators and are, moreover, merely conceptual representation of such resonators, that can be used in various implementations of the present application. It is appreciated that one of ordinary skill in the art understands that the conceptual representation of resonators in FIGS. 13A and 13B are merely for discussion purposes and to more concretely describe utilization of the present application's novel and inventive concepts in integrating PCM RF switches with various types of resonators in various monolithic and/or multi-chip system solutions. As such, many different types of resonators may be used in various implementations of the present application. For the purpose of the present application, and in order to maintain focus on its inventive concepts, illustrations of all details normally present in various types of resonators are avoided. Resonator 1304a in FIG. 13A generally corresponds to resonator and/or MEMS 304 in FIG. 3 and to resonator 1204 in FIG. 12. Similarly, resonator 1304b in FIG. 13B generally corresponds to resonator and/or MEMS 304 in FIG. 3 and to resonator 1204 in FIG. 12. As shown in FIG. 13A, resonator 1304a includes substrate 1342a, dielectric layer 1344a, first electrode 1374, piezoelectric material 1376, second electrode 1378, cavity 1352, and contacts/interconnects 1356 and 1358.

Substrate 1342a is situated under dielectric layer 1344a. In various implementations, substrate 1342a is a quartz substrate. Substrate 1342a includes cavity 1352. Cavity 1352 underlies first electrode 1374 and second electrode 1378. Dielectric layer 1344a is situated over substrate 1342a and under first electrode 1374. Dielectric layer 1344a electrically insulates substrate 1342a from first electrode 1374, and supports structures overlying cavity 1352 In various implementations, dielectric layer 1344a can comprise silicon oxide ($SiO_2$), silicon nitride ($Si_XN_Y$), or another dielectric. First electrode 1374 is situated over dielectric layer 1344a, and extends over cavity 1352. In various implementations, first electrode 1374 can comprise aluminum (Al), tungsten (W), molybdenum (Mo), or platinum (Pt).

Piezoelectric material 1376 can comprise any material exhibiting a piezoelectric effect. In various implementations, piezoelectric material 1376 can comprise lithium niobate ($LiNbO_3$), aluminum nitride ($Al_XN_Y$), or another piezoelectric. Second electrode 1378 is situated over piezoelectric material 1376, and extends over cavity 1352. In various implementations, second electrode 1378 can comprise aluminum (Al), tungsten (W), molybdenum (Mo), or platinum (Pt). Contacts/interconnects 1356 and 1358 are connected to conductive first electrode 1374 and second electrode 1378 respectively for providing electrical connections.

With proper resonant characteristics, piezoelectric material 1376 can act as a filter or oscillator resonating at a desired frequency between first electrode 1374 and second electrode 1378 based on an applied electrical signal. In the present implementation, resonator 1304a is a film bulk acoustic resonator (FBAR) having cavity 1352.

As shown in FIG. 13B, resonator 1304b includes substrate 1342b, Bragg reflector 1344b, first electrode 1374, piezoelectric material 1376, second electrode 1378, and contacts/interconnects 1356 and 1358. First electrode 1374, piezoelectric material 1376, second electrode 1378, and contacts/interconnects 1356 and 1358 in FIG. 13B generally correspond to similar structures in FIG. 13A.

Resonator 1304b in FIG. 13B is similar to resonator 1304a in FIG. 13A, except that in resonator 1304b in FIG. 13B first electrode 1374 and piezoelectric material 1376 are not situated over a dielectric layer over a cavity. Rather, first electrode 1374 and piezoelectric material 1376 are situated over Bragg reflector 1344b over substrate 1342b. Bragg reflector 1344b comprises alternating layers of low acoustic impedance material, such as silicon oxide ($SiO_2$), and high acoustic impedance material, such as tungsten (W). In the present implementation, resonator 1304b is a solidly mounted resonator (SMR). Notably, resonators 1304a and 1304b are merely exemplary resonators. Resonator and/or MEMS 304 in FIG. 3 and resonator 1204 in FIG. 12 can be any other type of resonator, such as a surface acoustic resonator (SAW). However, resonators 1304a and 1304b are known for their high quality factors. Accordingly, for high performance applications, resonators 1304a or 1304b can be used in a resonator array having high reliability, high reconfigurability, and low insertion loss, such as in resonator array 1270 in FIG. 12.

Figure 14:
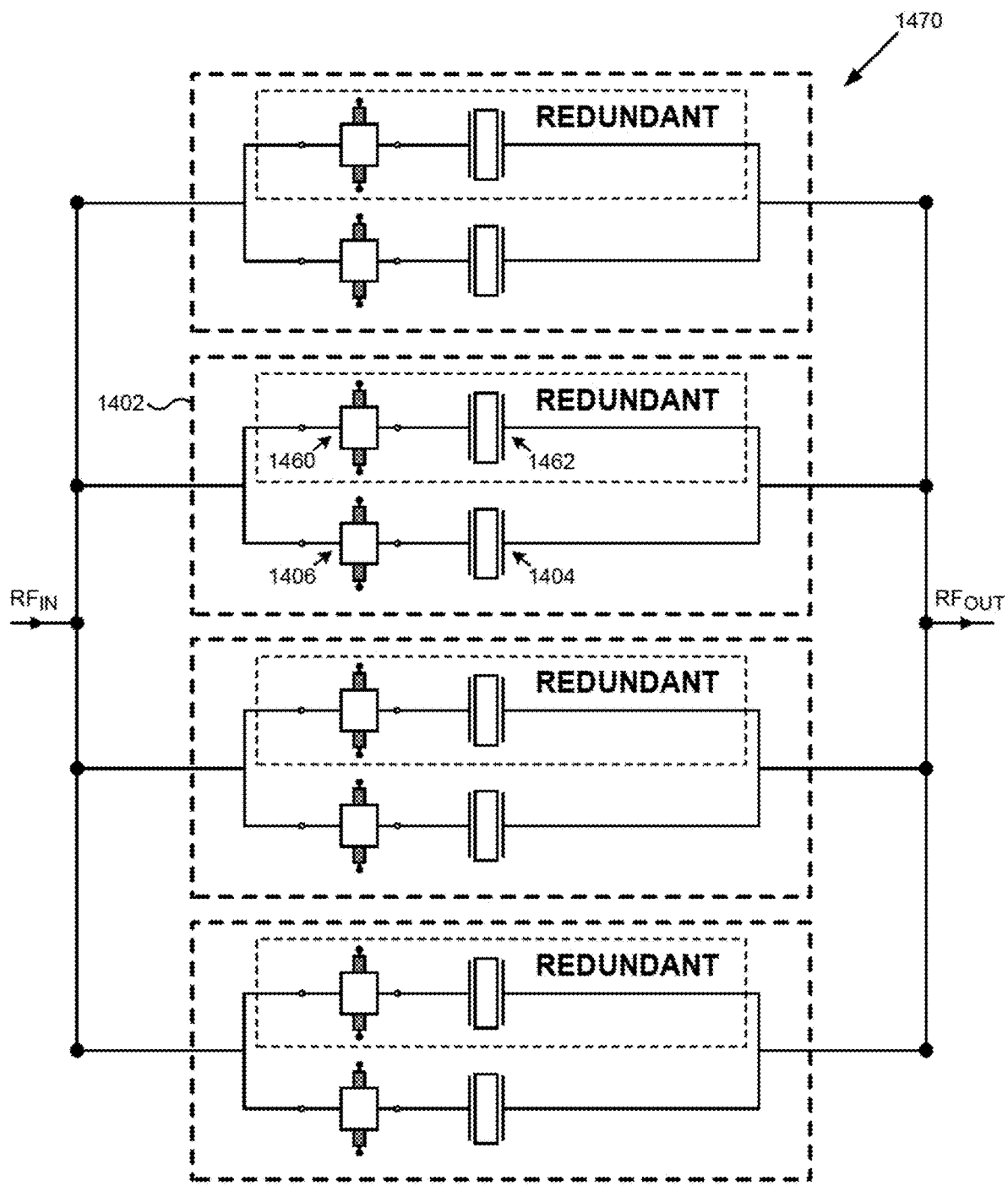
FIG. 14 illustrates a portion of a resonator array according to one implementation of the present application.

FIG. 14 illustrates a portion of a resonator array according to one implementation of the present application. Resonator array 1470 includes elements 1402. Each of elements 1402 includes primary resonator 1404, redundant resonator 1462, primary PCM switch 1406, and redundant PCM switch 1460. Resonator array 1470 generally corresponds to sub-array 1170 in FIG. 11C.

In resonator array 1470, primary PCM switch 1406 is electrically connected to primary resonator 1404. Redundant PCM switch 1460 is electrically connected to redundant resonator 1462. Primary PCM switch 1406 and redundant PCM switch 1460 are both electrically connected to RF input $RF_{IN}$. Primary resonator 1404 and redundant resonator 1462 may or may not be substantially co-located with each other in a semiconductor chip. Redundant PCM switch 1460 and redundant resonator 1462 serve as alternatives to their primaries.

For example, redundant PCM switch 1460 can be configured to engage redundant resonator 1462 in response to a fault in primary resonator 1404. A fault can be detected, for example, by MCU/ASIC 414 in FIG. 4 or by other monitoring circuitry. Primary PCM switch 1406 can also be configured to permanently disengage primary resonator 1404 in response to a fault. Accordingly, resonator array 1470 can use redundant PCM switches 1460 in each element 1402 to improve reliability against fault, without significantly increasing insertion loss.

Figure 15:
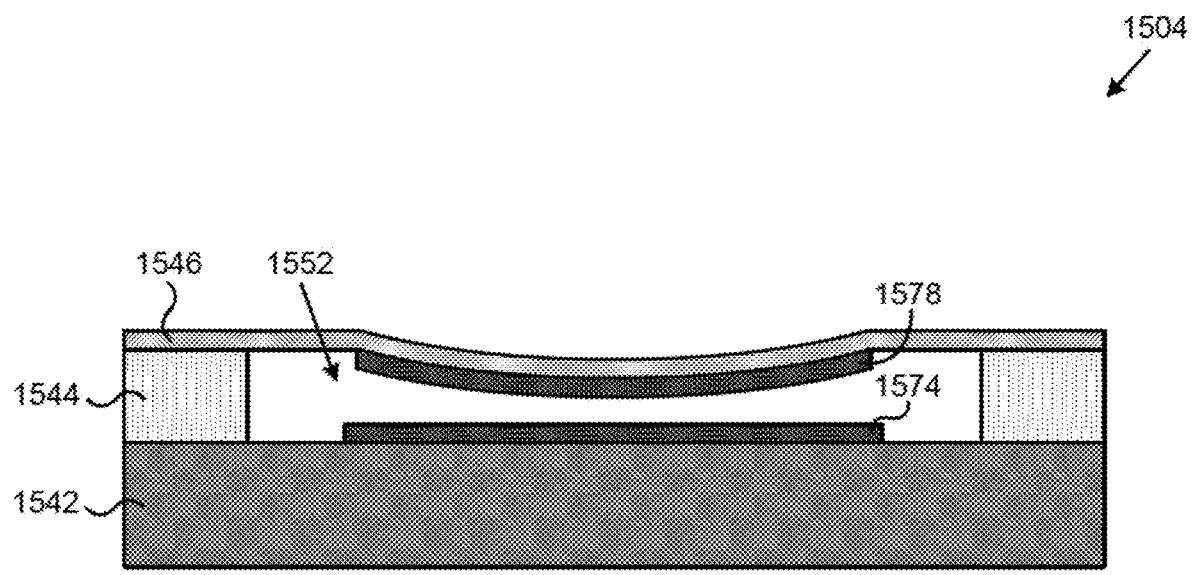
FIG. 15 illustrates a cross-sectional view of an example of a MEMS pressure sensor that can be used in various implementations of the present application.

By way of another example of a type of MEMS that can be used in various implementations of the present application, FIG. 15 illustrates a cross-sectional view of a MEMS pressure sensor. It is noted that FIG. 15 is merely one out of many possible representative drawings to address and discuss a type of MEMS, i.e. a MEMS pressure sensor and is, moreover, merely a conceptual representation of such a MEMS pressure sensor, that can be used in one implementation of the present application. It is appreciated that one of ordinary skill in the art understands that the conceptual representation of a MEMS pressure sensor in FIG. 15 is merely for discussion purposes and to more concretely describe utilization of the present application's novel and inventive concepts in integrating PCM RF switches with various types of MEMS in various monolithic and/or multi-chip system solutions. As such, many different types of MEMS, and specifically many different examples of MEMS pressure sensors, may be used in various implementations of the present application. For the purpose of the present application, and in order to maintain focus on its inventive concepts, illustrations of all details normally present in various types of MEMS or MEMS pressure sensors are avoided. MEMS pressure sensor 1504 in FIG. 15 generally corresponds to resonator and/or MEMS 304 in FIG. 3. As shown in FIG. 15, MEMS pressure sensor 1504 includes substrate 1542, dielectric layer 1544, diaphragm 1546, first electrode 1574, second electrode 1578, and cavity 1552.

Substrate 1542 is situated under dielectric layer 1544. In various implementations, substrate 1542 is a silicon (Si) or silicon-on-insulator (SOI) substrate. Dielectric layer 1544 is situated over substrate 1542 and under diaphragm 1546. Dielectric layer 1544 includes cavity 1552 and provides room for diaphragm 1546 to deflect. In various implementations, dielectric layer 1544 can comprise silicon oxide ($SiO_2$), silicon nitride ($Si_xN_y$), or another dielectric. First electrode 1574 is situated in cavity 1552 on substrate 1542. MEMS pressure sensor 1504 may have insulating layers (not shown in FIG. 15) between first electrode 1574 and substrate 1542. First electrode 1574 can comprise aluminum (Al), tungsten (W), molybdenum (Mo), or platinum (Pt). Diaphragm 1546 is situated over dielectric layer 1544, and extends across cavity 1552. Diaphragm 1546 is sensitive to pressure changes and deflects in response to pressure changes. In various implementations, diaphragm 1546 is metal, ceramic, or silicon (Si).

Second electrode 1578 is situated in cavity 1552 on diaphragm 1546. MEMS pressure sensor 1504 may have insulating layers (not shown in FIG. 15) between first electrode 1574 and second electrode 1578. Second electrode 1578 can comprise aluminum (Al), tungsten (W), molybdenum (Mo), or platinum (Pt). First electrode 1574 and second electrode 1578 may be connected to contacts/interconnects in another plane not visible in the cross-sectional view of FIG. 15.

In the present implementation, MEMS pressure sensor 1504 is a capacitive pressure sensor. First electrode 1574 and second electrode 1578 act as plates of a capacitor with cavity 1552 between first electrode 1574 and second electrode 1578 providing the dielectric of the capacitor. The deflection of diaphragm 1546 changes the capacitance. This change in capacitance can be translated into an electrical signal by external circuitry. Notably, MEMS pressure sensor 1504 is merely exemplary. Resonator and/or MEMS 304 in FIG. 3 can be any other type of MEMS pressures sensor, such as a piezoresistive pressure sensor.

FIGS. 16A, 16B, 16C, and 16D illustrate diagrams of arrays of MEMS pressure sensors and corresponding sensitivity/linearity graphs according to one implementation of the present application. MEMS pressure sensor array 1600 includes elements 1602A, 1602B, 1602C, and 1602D. Each element 1602A, 1602B, 1602C, and 1602D includes a PCM switch (such as PCM switch 606 in FIG. 6) and a MEMS pressure sensor (such as MEMS pressure sensor 1504 in FIG. 15). FIGS. 16A, 16B, 16C, and 16D illustrate an array of MEMS pressure sensors suitable for implementation in a radiosonde atmospheric measurement system. The MEMS pressure sensor of elements 1602A, 1602B, 1602C, and 1602D have different characteristics (e.g., different diaphragm dimensions, different sensitivities, different linearities, etc.).

Graphs 1680a, 1680b, 1680c, and 1680d show sensitivity/linearity graphs. Each of graphs 1680a, 1680b, 1680c, and 1680d represents the sensitivity and/or linearity (e.g., a weighted product of sensitivity and linearity) versus the applied pressure for the four MEMS pressure sensors of MEMS pressure sensor array 1600 (referred to as Sensors A, B, C, and D; corresponding to elements 1602A, 1602B, 1602C, and 1602D respectively). Numerical values for pressure and the slopes of sensitivity and/or linearity are merely exemplary, and not intended to correspond to actual or experimental values.

Figure 16A:
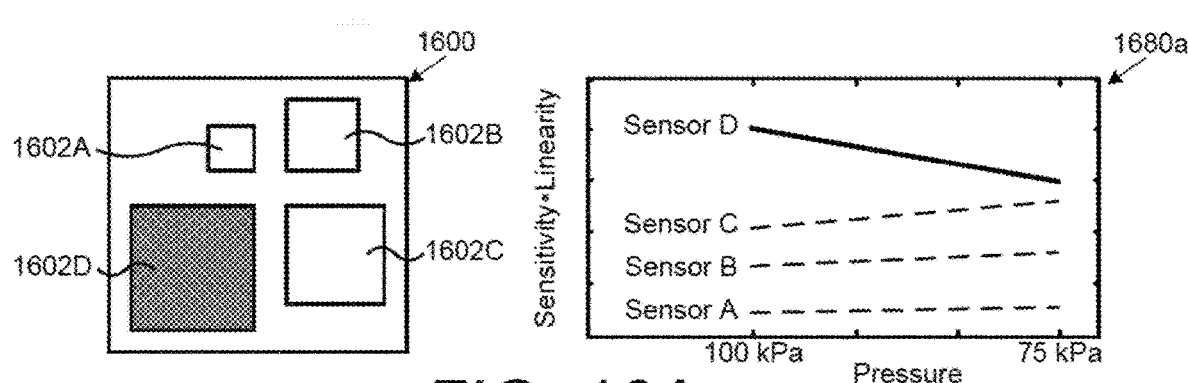
FIGS. 16A, 16B, 16C, and 16D illustrate diagrams of arrays of MEMS pressure sensors and corresponding sensitivity/linearity graphs according to one implementation of the present application.

As shown in graph 1680a in FIG. 16A, between the pressures of one hundred kilo-Pascals and seventy five kilo-Pascals (100 kPa-75 kPa), Sensor D experiences the highest sensitivity and/or linearity combination of any MEMS pressure sensor in MEMS pressure sensor array 1600. Accordingly, element 1602D is engaged using PCM switches. With this element engaged, MEMS pressure sensor array 1600 in FIG. 16A may be configured for high pressure measurement.

Figure 16B:
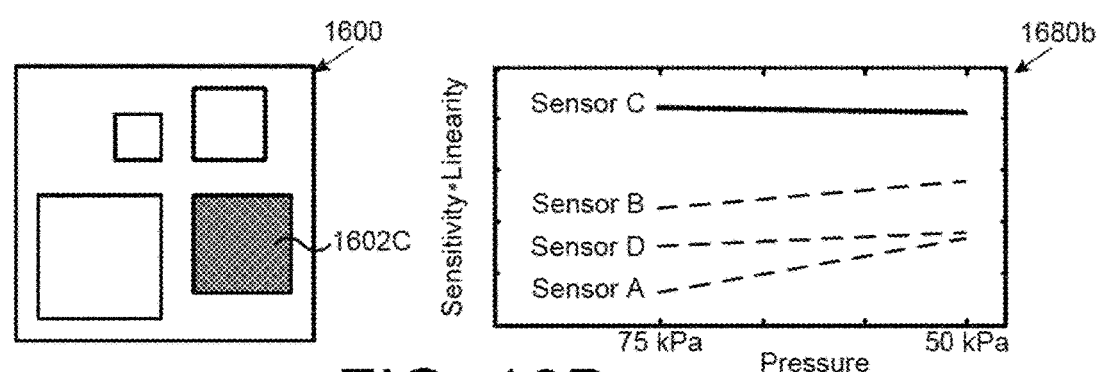

As shown in graph 1680b in FIG. 16B, between the pressures of seventy five kilo-Pascals and fifty kilo-Pascals (75 kPa-50 kPa), Sensor C experiences the highest sensitivity and/or linearity combination of any MEMS pressure sensor in MEMS pressure sensor array 1600. Accordingly, MEMS pressure sensor array 1600 has been reconfigured using PCM switches, and element 1602C is engaged. With this element engaged, MEMS pressure sensor array 1600 in FIG. 16B may be configured for medium-high pressure measurement.

Figure 16C:
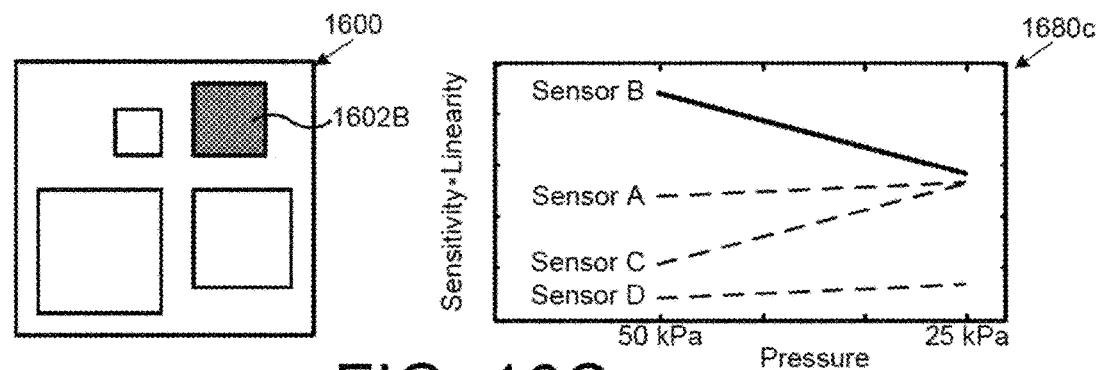

As shown in graph 1680c in FIG. 16C, between the pressures of fifty kilo-Pascals and twenty five kilo-Pascals (50 kPa-25 kPa), Sensor B experiences the highest sensitivity and/or linearity combination of any MEMS pressure sensor in MEMS pressure sensor array 1600. Accordingly, MEMS pressure sensor array 1600 has been reconfigured using PCM switches, and element 1602B is engaged. With this element engaged, MEMS pressure sensor array 1600 in FIG. 16C may be configured for medium-low pressure measurement.

Figure 16D:
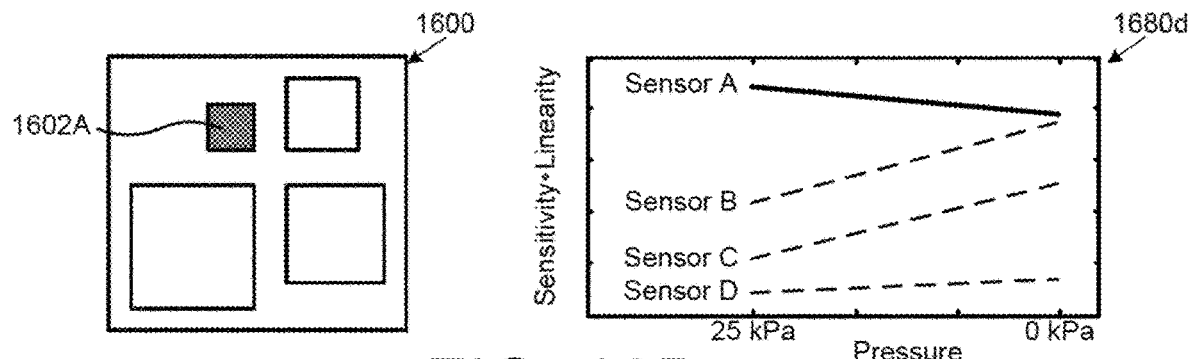

As shown in graph 1680d in FIG. 16D, between the pressures of twenty five kilo-Pascals and zero kilo-Pascals (25 kPa-0 kPa), Sensor A experiences the highest sensitivity and/or linearity combination of any MEMS pressure sensor in MEMS pressure sensor array 1600. Accordingly, MEMS pressure sensor array 1600 has been reconfigured using PCM switches, and element 1602A is engaged. With this element engaged, MEMS pressure sensor array 1600 in FIG. 16D may be configured for low pressure measurement.

Thus, by utilizing elements with different sensitivity and/or linearity characteristics, MEMS pressure sensor array 1600 can be reconfigured in various combinations to achieve a reconfigurable pressure sensor. MEMS pressure sensor array 1600 can include more or fewer elements than shown in FIGS. 16A, 16B, 16C, and 16D. Because MEMS pressure sensor array 1600 has relatively low insertion loss, MEMS pressure sensor array 1600 can include more elements for the same total insertion loss as a conventional array. In one implementation, each element 1602A, 1602B, 1602C, and 1602D can include multiple MEMS pressure sensors and multiple switches for averaging. In one implementation, each element 1602A, 1602B, 1602C, and 1602D can include a primary MEMS pressure sensor, a primary PCM switch, a redundant MEMS pressure sensor, and a redundant PCM switch. Accordingly, MEMS pressure sensor array 1600 achieves improved reconfigurability, accuracy, and reliability.

Although FIGS. 16A, 16B, 16C, and 16C illustrate an array of MEMS pressure sensors suitable for implementation in a radiosonde atmospheric measurement system, it is understood that a MEMS pressure sensor array using PCM switches according to the present application may have any other implementation. For example, a MEMS pressure sensor array can be used for underwater vehicle navigation. In this implementation, PCM switches could be used to reconfigure the array, for example, when the vehicle switches directions. In various implementations, a MEMS pressure sensor array using PCM switches according to the present application could also be used in industrial pressure sensor systems or in tire pressure sensor systems.

Thus, various implementations of the present application achieve semiconductor chips or systems having PCM switches integrated with resonators and/or MEMS, and utilize the inventive PCM switch of the present application to overcome the deficiencies in the art and achieve improved reconfigurability, accuracy, and reliability. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor chip comprising:
a substrate;
a resonator and/or a micro-electrical-mechanical system (MEMS);
a phase-change material (PCM) switch comprising;
a heating element;
a thermally conductive and electrically insulating material over said heating element;
a PCM situated over said thermally conductive and electrically insulating material;
PCM contacts connected to passive segments of said PCM;
said heating element transverse to said PCM and approximately defining an active segment of said PCM;
one of said PCM contacts of said PCM switch electrically connected to said resonator and/or said MEMS in said semiconductor chip;
said PCM switch configured to engage or disengage said resonator and/or said MEMS.

2. The semiconductor chip of claim 1, wherein said resonator and/or said MEMS is one of a radio frequency (RF) filter, an oscillator, a microphone, a speaker, and a pressure sensor.

3. The semiconductor chip of claim 1, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

4. The semiconductor chip of claim 1, wherein said resonator and/or said MEMS is engaged when said PCM is in a crystalline phase.

5. A semiconductor chip comprising:
a substrate;
an array of resonators and/or an array of micro-electrical-mechanical systems (MEMS);
a plurality of phase-change material (PCM) switches, each comprising;
a heating element;
a thermally conductive and electrically insulating material over said heating element;
a PCM situated over said thermally conductive and electrically insulating material;
PCM contacts connected to passive segments of said PCM;
said heating element transverse to said PCM and approximately defining an active segment of said PCM;
each of said plurality of PCM switches electrically connected to a resonator in said array of resonators and/or to a MEMS in said array of MEMS;
said plurality of PCM switches capable of reconfiguring said array of resonators and/or said array of MEMS.

6. The semiconductor chip of claim 5, wherein said plurality of PCM switches are connected to a microcontroller (MCU) or an application specific integrated circuit (ASIC).

7. The semiconductor chip of claim 5, further comprising another plurality of PCM switches each electrically connected to another resonator in another array of resonators and/or to another MEMS in another array of MEMS, said plurality of PCM switches and said another plurality of PCM switches capable of providing averaging signals.

8. The semiconductor chip of claim 7, wherein each resonator in said array of resonators and/or each MEMS said array of MEMS is substantially co-located with a corresponding resonator in said another array of resonators and/or with a corresponding MEMS in said another array of MEMS.

9. The semiconductor chip of claim 5, wherein said array of resonators and/or said array of MEMS comprise radio frequency (RF) filters, oscillators, microphones, speakers, or pressure sensors.

10. The semiconductor chip of claim 5, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

11. The semiconductor chip of claim 5, wherein a resonator in said array of resonators and/or a MEMS in said array of MEMS is engaged when said PCM is in a crystalline phase.

12. A semiconductor chip comprising:
a substrate;
a primary resonator and/or a primary micro-electrical-mechanical system (MEMS);
a redundant resonator and/or a redundant micro-electrical-mechanical system (MEMS);
a primary and a redundant phase-change material (PCM) switch, each comprising:
a heating element;
a thermally conductive and electrically insulating material over said heating element;

a PCM situated over said thermally conductive and electrically insulating material;

PCM contacts connected to passive segments of said PCM;

said heating element transverse to said PCM and approximately defining an active segment of said PCM;

on of said PCM contacts of said primary PCM switch electrically connected to said primary resonator and/or said primary MEMS;

one of said PCM contacts of said redundant PCM switch electrically connected to said redundant resonator and/or said redundant MEMS.

13. The semiconductor chip of claim 12, wherein said redundant PCM switch is capable of engaging said redundant resonator and/or said redundant MEMS in response to a fault in said primary resonator and/or said primary MEMS.

14. The semiconductor chip of claim 12, wherein said primary PCM switch is capable of disengaging said primary resonator and/or said primary MEMS in response to a fault in said primary resonator and/or said primary MEMS.

15. The semiconductor chip of claim 12, wherein said primary resonator and/or said primary MEMS and said redundant resonator and/or said redundant MEMS are substantially co-located.

16. The semiconductor chip of claim 12, wherein said primary resonator and/or said primary MEMS and said redundant resonator and/or said redundant MEMS comprise radio frequency (RF) filters, oscillators, microphones, speakers, or pressure sensors.

17. The semiconductor chip of claim 12, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

* * * * *